US006982896B2

(12) United States Patent
Kang

(10) Patent No.: US 6,982,896 B2
(45) Date of Patent: Jan. 3, 2006

(54) NONVOLATILE FERROELECTRIC MEMORY DEVICE HAVING A MULTI-BIT CONTROL FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 161 days.

(21) Appl. No.: 10/737,833

(22) Filed: Dec. 18, 2003

(65) Prior Publication Data

US 2005/0024913 A1 Feb. 3, 2005

(30) Foreign Application Priority Data

Jul. 30, 2003 (KR) .................. 10-2003-0052662

(51) Int. Cl.
*G11C 7/14* (2006.01)
(52) U.S. Cl. .............. 365/145; 365/210; 365/230.03; 365/233; 365/189.07; 365/189.05; 365/203
(58) Field of Classification Search .............. 365/145, 365/210, 233, 203, 230.03, 189.07, 189.05
See application file for complete search history.

(56) References Cited

U.S. PATENT DOCUMENTS

| 6,067,244 | A | 5/2000 | Ma et al. |
| 6,272,594 | B1 | 8/2001 | Gupta et al. |
| 6,301,145 | B1 | 10/2001 | Nishihara |
| 6,314,016 | B1 | 11/2001 | Takasu |
| 6,363,439 | B1 | 3/2002 | Battles et al. |
| 6,826,097 | B2 * | 11/2004 | Kang .................. 365/196 |
| 6,870,785 | B1 * | 3/2005 | Kang .................. 365/210 |
| 2003/0099125 | A1 * | 5/2003 | Kang .................. 365/145 |
| 2004/0233696 | A1 * | 11/2004 | Kang .................. 365/145 |

FOREIGN PATENT DOCUMENTS

KR 1020040059009 A 7/2004

* cited by examiner

*Primary Examiner*—Viet Q. Nguyen
(74) *Attorney, Agent, or Firm*—Heller Ehrman LLP

(57) ABSTRACT

A nonvolatile ferroelectric memory device having a multi control function can determine a plurality of cell data in a reference timing strobe interval by setting a plurality of sensing voltage levels when cell data are sensed in a sensing critical voltage. In a read mode, a plurality of read data applied from a cell array block are stored in a timing data register array unit through a common data bus unit. In a write mode, a plurality of read data stored in the timing data register array unit or input data applied from a timing data buffer unit are stored in a cell array block through the common data bus unit. Here, since a plurality of sensing voltage levels are set in cell data, a plurality of sensed data bits can be stored in one cell.

20 Claims, 23 Drawing Sheets

NONVOLATILE FERROELECTRIC MEMORY DEVICE HAVING A MULTI-BIT CONTROL FUNCTION

BACKGROUND OF THE INVENTION

1. Field of the Invention

The present invention generally relates to a nonvolatile ferroelectric memory device having a multi-bit control function, and more specifically, to a technology for storing and sensing multi-bit data in a ferroelectric memory cell.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

In the conventional nonvolatile ferroelectric memory, a sensing reference voltage is set to have a proper level when cell data are sensed.

However, as a chip operation voltage of the FeRAM becomes lower, the level of the reference voltage to sense a cell also becomes lower. When the sensing voltage level of the cell data is low, a voltage margin between the sensing voltage and the reference voltage is reduced. As a result, it is difficult to determine data. Also, a sensing margin is reduced by a voltage level change of the reference voltage. Therefore, it is difficult to obtain a rapid operation speed of the FeRAM chip having a 1T1C (1transistor, 1capacitor).

As a semiconductor memory device becomes smaller, the size of cell also becomes smaller. As a result, a technology for storing a plurality of multi-bit data in a cell is required to improve the efficiency of the cell size.

SUMMARY OF THE INVENTION

Accordingly, it is an object of the present invention to detect a plurality of data levels and stored a plurality of data bits in a cell with a sensing critical voltage in a different reference timing strobe interval.

It is another object of the present invention to sense a plurality of data levels with a plurality of sensing critical voltages in a timing strobe interval, thereby storing a plurality of data bits in a cell.

It is still another object of the present invention to embody a chip having an improved data access time by storing a plurality of read/written data through a register.

It is still another object of the present invention to secure the margin of a sensing voltage and improve the operation speed in the embodiment of a chip having a low voltage or a rapid access time by amplifying a self-sensing voltage of cell data in a reference timing interval and judging a plurality of voltage levels of data on a basis of a time axis.

In an embodiment, a nonvolatile ferroelectric memory device having a multi-bit control function comprises a plurality of cell array blocks, a timing data register array unit and a common data bus unit. The plurality of cell array blocks outputs a plurality of different cell data sensing voltages induced in a main bitline in a reference timing strobe interval. Here, each of the plurality of cell array blocks comprises a nonvolatile ferroelectric memory. The timing data register array unit compares the plurality of cell data sensing voltages with a plurality of preset sensing critical voltages to output comparison results corresponding to a plurality of bit data, and converts a plurality of inputted bit data or the plurality of cell data sensing voltage into analog reference level signals. The common data bus unit, connected in common to the plurality of cell array blocks, controls data exchange between the plurality of cell array blocks and the timing data register array unit.

In another embodiment, a nonvolatile ferroelectric memory device having a multi-bit control function comprises a plurality of cell array blocks, a timing data register array unit and a common data bus unit. The plurality of cell array blocks output a plurality of difference cell data sensing voltages induced to a main bitline in a reference timing strobe interval. Here, each of the plurality of cell array blocks comprises a nonvolatile ferroelectric memory. The timing data register array unit outputs a plurality of bit data corresponding to a plurality of sensing data levels detected when the plurality of cell data sensing voltages reach a preset sensing critical voltage, and converts a plurality of inputted bit data or the plurality of sensing data levels into analog reference level signals. The common data bus unit, connected in common to the plurality of cell array blocks, controls data exchange between the plurality of cell array blocks and the timing data register array unit.

DETAILED DESCRIPTION OF THE PREFERRED EMBODIMENTS

The present invention will be described in detail with reference to the accompanying drawings.

Figure 1:
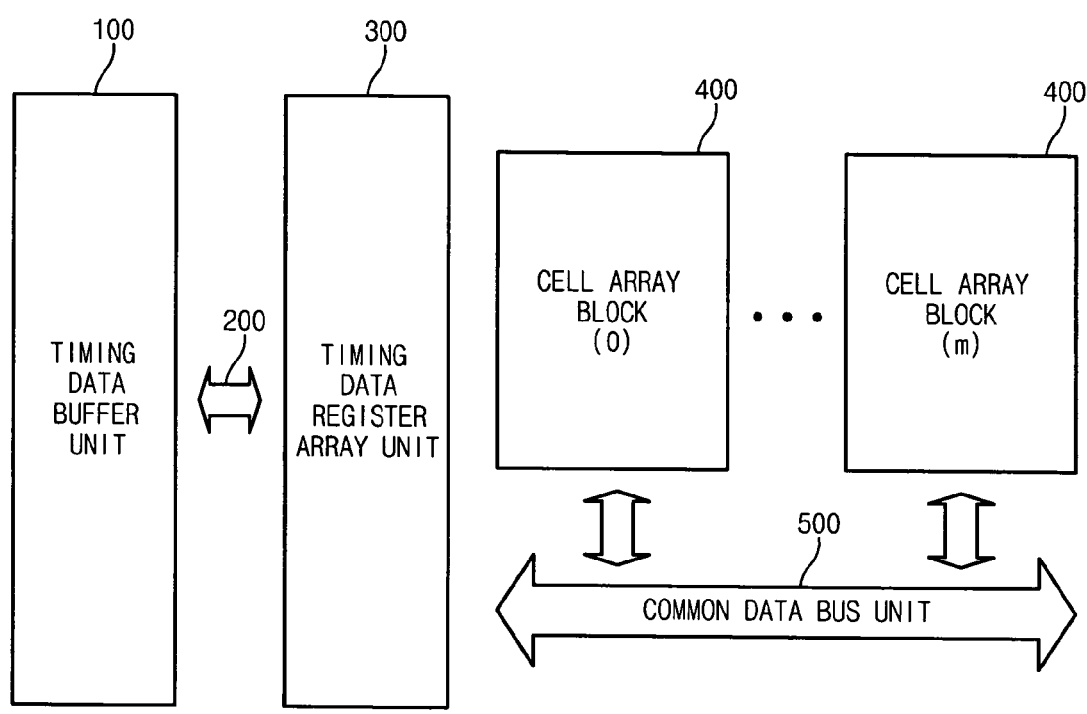
FIG. 1 is a diagram of a nonvolatile ferroelectric memory device having a multi-bit control function according to a first embodiment of the present invention.

FIG. 1 is a diagram of a nonvolatile ferroelectric memory device having a multi-bit control function according to a first embodiment of the present invention.

In an embodiment, the nonvolatile ferroelectric memory device comprises a timing data buffer unit 100, a data buffer bus unit 200, a timing data register array unit 300, a plurality of cell array blocks 400 and a common data bus unit 500.

The cell array block 400 comprises a plurality of cell arrays for storing data. The cell array block 400 comprises a bitline cell array having a multi-bitline structure comprising sub bitlines and a main bitline. The multi-bitline structure cell array converts a sensing voltage of the sub bitline into current, and induces a main bitline sensing voltage. Here, the plurality of cell array blocks 400 share the common data bus unit 500.

The timing data buffer unit 100 is connected to the timing data register array unit 300 through the data buffer bus unit 200. The timing data register array unit 300 determines data "high" and "low" based on when a voltage level of data passes a sensing critical voltage in sensing data of the common data bus unit 500.

In a read mode, data read from the cell array block 400 are stored in the timing data register array unit 300 through the common data bus unit 500. The read data stored in the timing data register array unit 300 are outputted into the timing data buffer unit 100 through the data buffer bus unit 200.

In a write mode, input data inputted through the timing data buffer unit 100 are stored in the timing data register array unit 300 through the data buffer bus unit 200. The input data or read data stored in the timing data register array unit 300 are written in the cell array block 400 through the common data bus unit 500.

Figure 2:
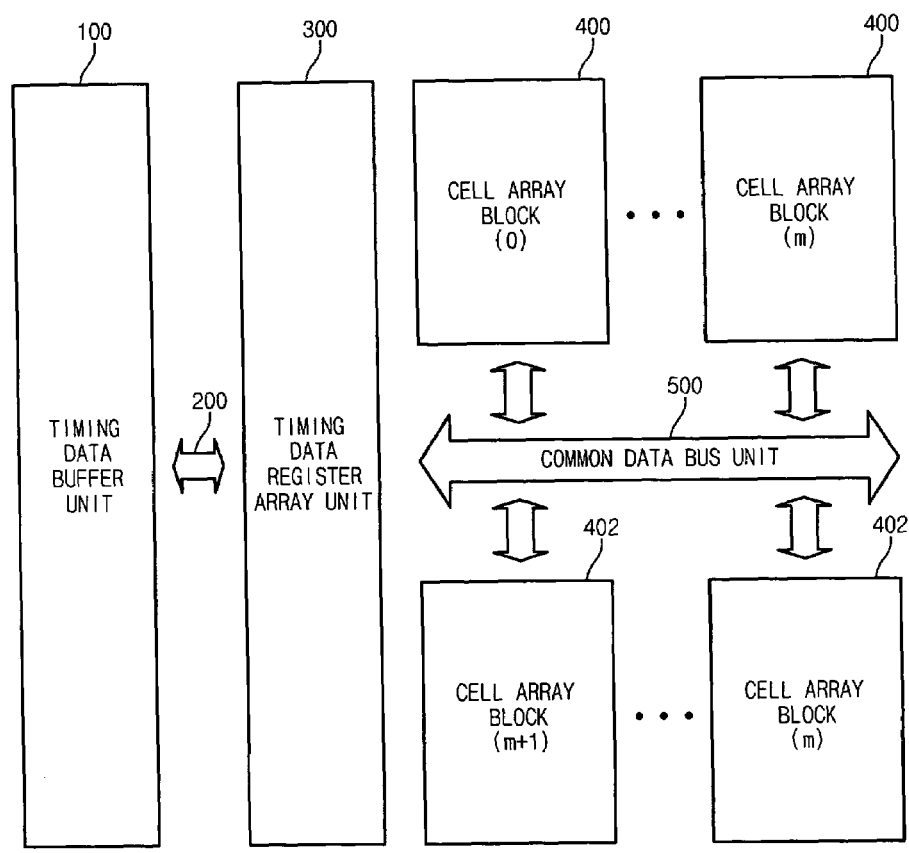
FIG. 2 is a diagram of a nonvolatile ferroelectric memory device having a multi-bit control function according to a second embodiment of the present invention.

FIG. 2 is a diagram of a nonvolatile ferroelectric memory device having a multi-bit control function according to a second embodiment of the present invention.

In an embodiment of FIG. 2, a plurality of cell array blocks 400 are arranged above the common data bus unit 500, and a plurality of cell array blocks 402 are arranged under the common data bus unit 500. The common data bus unit 500 is shared by the plurality of cell array blocks 400 and 402. The rest structure is the same as that of FIG. 1.

Figure 3:
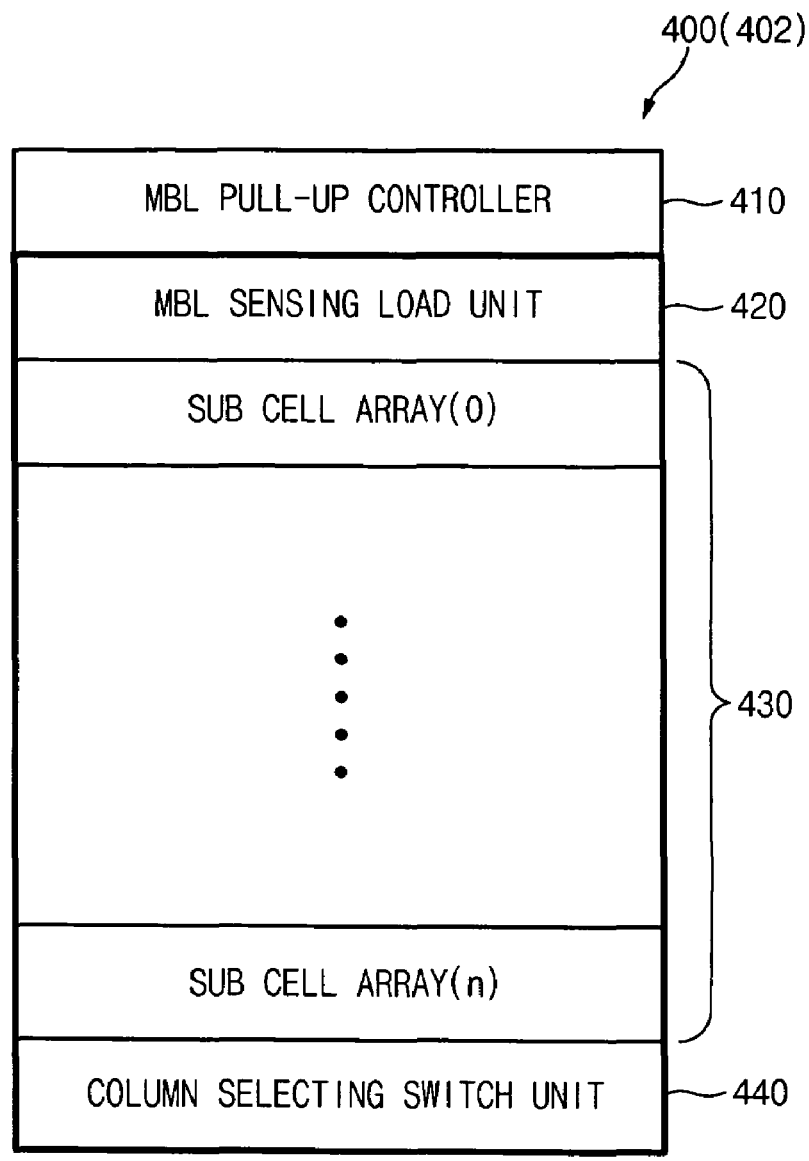
FIG. 3 is a diagram of a cell array block of FIGS. 1 and 2.

FIG. 3 is a diagram of the cell array block 400 of FIGS. 1 and 2.

The cell array block 400 comprises a MBL (main bitline) pull-up controller 410, a main bitline sensing load unit 420, a plurality of sub cell arrays 430 and a column selecting switch unit 440.

Here, a main bitline of the plurality of sub cell arrays 430 is connected to the common data bus unit 500 through the column selecting switch unit 440.

Figure 4:
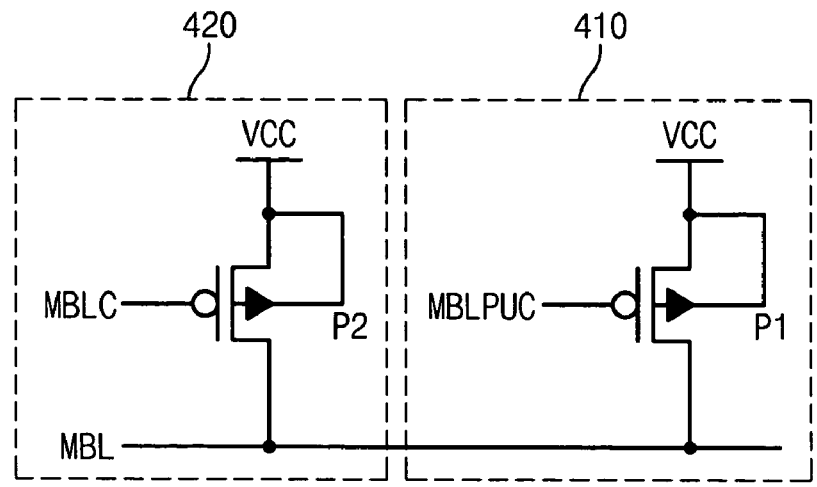
FIG. 4 is a circuit diagram of a main bitline pull-up controller and a main bitline sensing load unit of FIG. 3.

FIG. 4 is a circuit diagram of the main bitline pull-up controller 410 and the main bitline sensing load unit 420 of FIG. 3.

The MBL pull-up controller 410 comprises a PMOS transistor P1 for pulling up a voltage of a main bitline MBL in a precharge mode. The PMOS transistor P1 has a source connected to a power voltage VCC terminal, a drain connected to the main bitline MBL, and a gate to receive a main bitline pull-up control signal MBLPUC.

The main bitline sensing load unit 420 comprises a PMOS transistor P2 for controlling sensing load of the main bitline MBL. The PMOS transistor P2 has a source connected to a power voltage VCC terminal, a drain connected to the main bitline MBL and a gate to receive a main bitline control signal MBLC.

Figure 5:
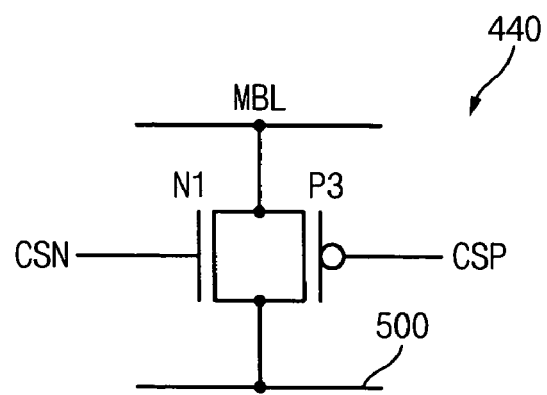
FIG. 5 is a circuit diagram of a column selecting switch unit of FIG. 3.

FIG. 5 is a circuit diagram of the column selecting switch unit 440 of FIG. 3.

The column selecting switch unit 440 comprises an NMOS transistor N1 and a PMOS transistor P3. Here, the NMOS transistor N1, connected between the main bitline MbL and the common data bus unit 500, has a gate to receive a column selecting signal CSN. The PMOS transistor P3, connected between the main bitline MBL and the common data bus unit 500, has a gate to receive a column selecting signal CSP.

Figure 6:
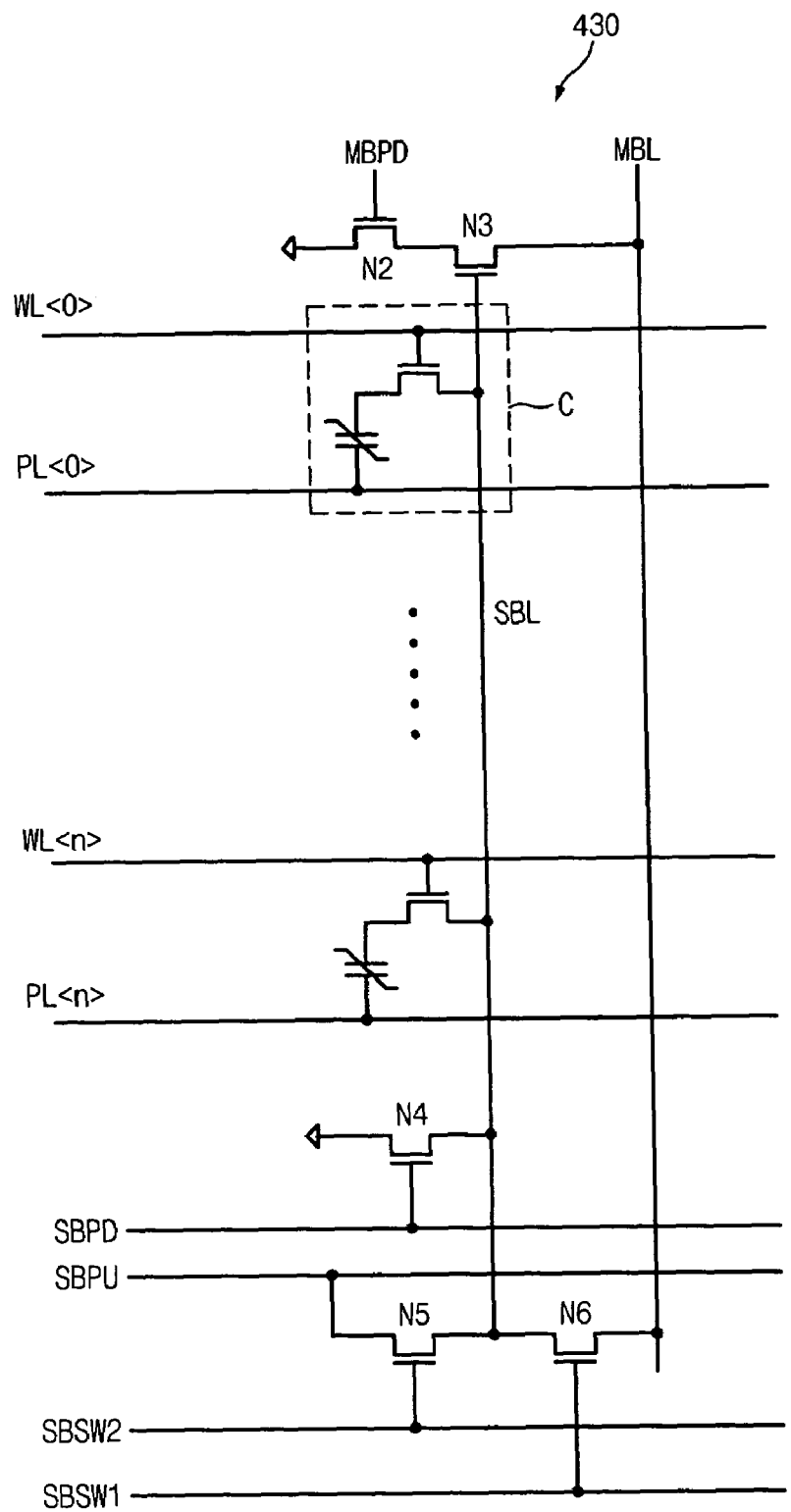
FIG. 6 is a circuit diagram of a sub cell array of FIG. 3.

FIG. 6 is a circuit diagram of the sub cell array 430 of FIG. 3.

Each main bitline MBL of the sub cell array 430 is selectively connected to one of a plurality of sub bitlines SBL. That is, when a sub bitline selecting signal SBSW1 is activated, an NMOS transistor N6 is turned on, thereby activating one sub bitline SBL. One sub bitline SBL is connected to a plurality of cells C.

When a sub bitline pull-down signal SBPD is activated to turn on an NMOS transistor N4, the sub bitline SBL is pulled down to a ground level. A sub bitline pull-up signal SBPU is to control power supplied to the sub bitline SBL. That is, in a low voltage, the sub cell array 420 generates a voltage higher than a power voltage VCC and supplies the voltage to the sub bitline SBL.

An NMOS transistor N5 controls connection between a sub bitline pull-up signal SBPU terminal and the sub bitline SBL in response to a sub bitline selecting signal SBSW2.

An NMOS transistor N3, connected between an NMOS transistor N2 and the main bitline MBL, has a gate connected to the sub bitline SBL. The NMOS transistor N2, connected between the ground voltage terminal and the NMOS transistor N3, has a gate to receive a main bitline pull-down signal MBPD, thereby regulating a sensing voltage of the main bitline MBL.

Figure 7:
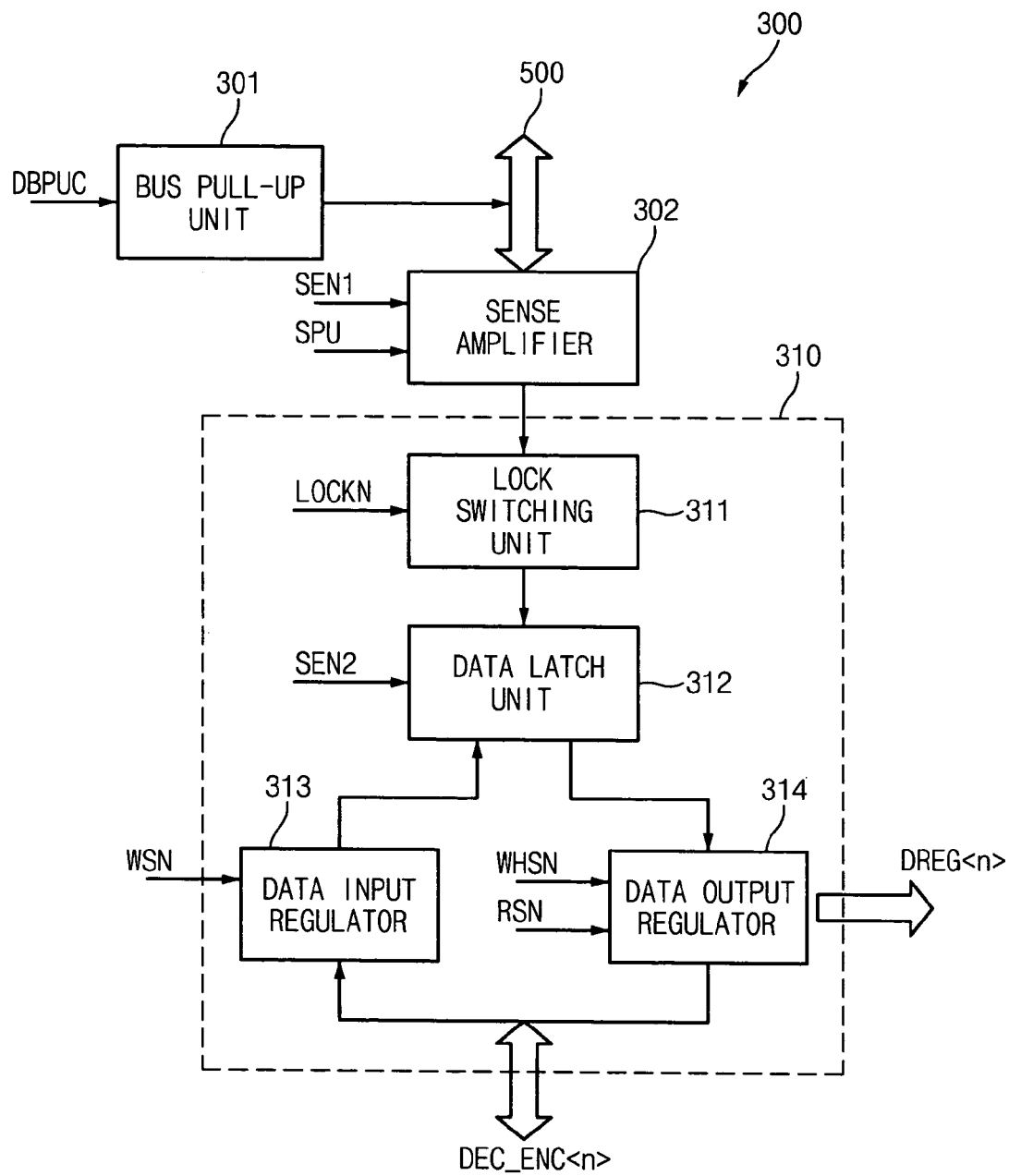
FIG. 7 is a diagram of a timing data register array unit of FIGS. 1 and 2.

FIG. 7 is a diagram of the timing data register array 300 unit of FIGS. 1 and 2.

The timing data register array unit 300 comprises a bus pull-up unit 301, a sense amplifier unit 302 and a data register 310. Here, the data register 310 comprises a lock switching unit 311, a data latch unit 312, a data input regulator 313 and a data output regulator 314.

In a precharge mode, the bus pull-up unit 301 pulls up the common data bus unit 500 to a high level in response to a data bus pull-up control signal DBPUC. The sense amplifier 302 senses read data applied from the common data bus unit 500 in response to a sensing control signal SEN1 and a sensing pull-up control signal SPU.

The lock switching unit 311 outputs data applied from the sense amplifier unit 302 into the data latch unit 312 in response to a lock signal LOCKN. The data latch unit 312 stores read data applied from the lock switching unit 311 and input data applied from the data input regulator 313 in response to a sensing control signal SEN2.

In the write mode, the data input regulator 313 outputs a coding signal DEC_ENC<n> applied from a decoder into the data latch unit 312 in response to a write control signal WSN. The data output regulator 314 outputs data applied from the data latch unit 312 as data register signals DREG<n> into a D/A converter or the data buffer bus unit 200 in response to a control signal WHSN and a read control signal RSN.

In the read mode, the timing data register array unit 300 senses cell data applied from the common data bus unit 500 through the sense amplifier unit 302, and stores the sensed data in the data latch unit 312 through the lock switching unit 311. Data stored in the data latch unit 312 are outputted into the data buffer bus unit 200 through the data output regulator 314. Data stored in the data output regulator 314 are feedback outputted as data register signals DREG<n> into a D/A converter 350, and used to restore destroyed data.

In the write mode, data applied from the data buffer bus unit 200 are stored in the data latch unit 312 through the data input regulator 313. Data stored in the data latch unit 312 are outputted into the common data bus unit 500 through the data output regulator 314.

Figure 8:
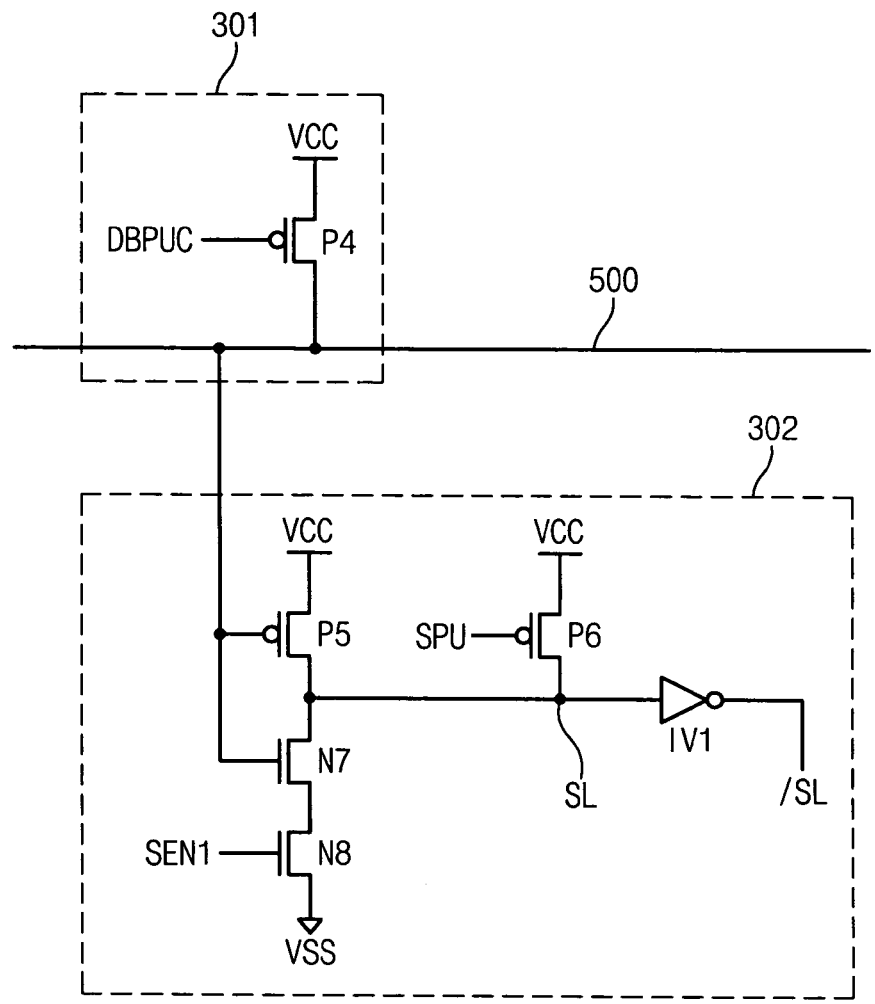
FIG. 8 is a circuit diagram of a bus pull-up unit and a sense amplifier of FIG. 7.

FIG. 8 is a circuit diagram of the bus pull-up unit 301 and the sense amplifier 302 of FIG. 7.

The bus pull-up unit 301 comprises a PMOS transistor P4 for pulling up the common data bus unit 500 to a power voltage VCC level in a precharge mode. The PMOS transistor P4, connected between the power voltage VCC terminal and the common data bus unit 500, has a gate to receive a data bus pull-up control signal DBPUC.

The sense amplifier unit 302 comprises PMOS transistors P5, P6, NMOS transistors N7, N8 and an inverter IV1. The PMOS transistor P5, connected between the power voltage VCC terminal and a node SL, has a gate connected to the common data bus unit 500.

The PMOS transistor P6, connected between the power voltage VCC terminal and the node SL, has a gate to receive a sensing pull-up control signal SPU. In the precharge mode, when the sensing pull-up control signal SPU is disabled, the PMOS transistor P6 pulls up the node SL to the power voltage VCC level. In an active mode, the sensing pull-up control signal SPU is inactivated, and the sensing control signal SEN1 is activated, thereby activating the PMOS transistor P5 and the NMOS transistor N7.

The NMOS transistor N7, connected between the node SL and the NMOS transistor N8, has a gate connected to the common data bus unit 500. The NMOS transistor N8, connected between the NMOS transistor N7 and the ground voltage terminal, has a gate to receive the sensing control signal SEN1. Here, the sensing control signal SEN1 determines activation of the PMOS transistor P5 and the NMOS transistor N7 to sense data levels of the common data bus unit 500.

The inverter IV1 inverts a signal of the node SL, and outputs the inverted signal into the node /SL. Here, in the active interval, the sensing pull-up control signal SPU and the sensing control signal SEN1 are enabled to a high level.

Figure 9:
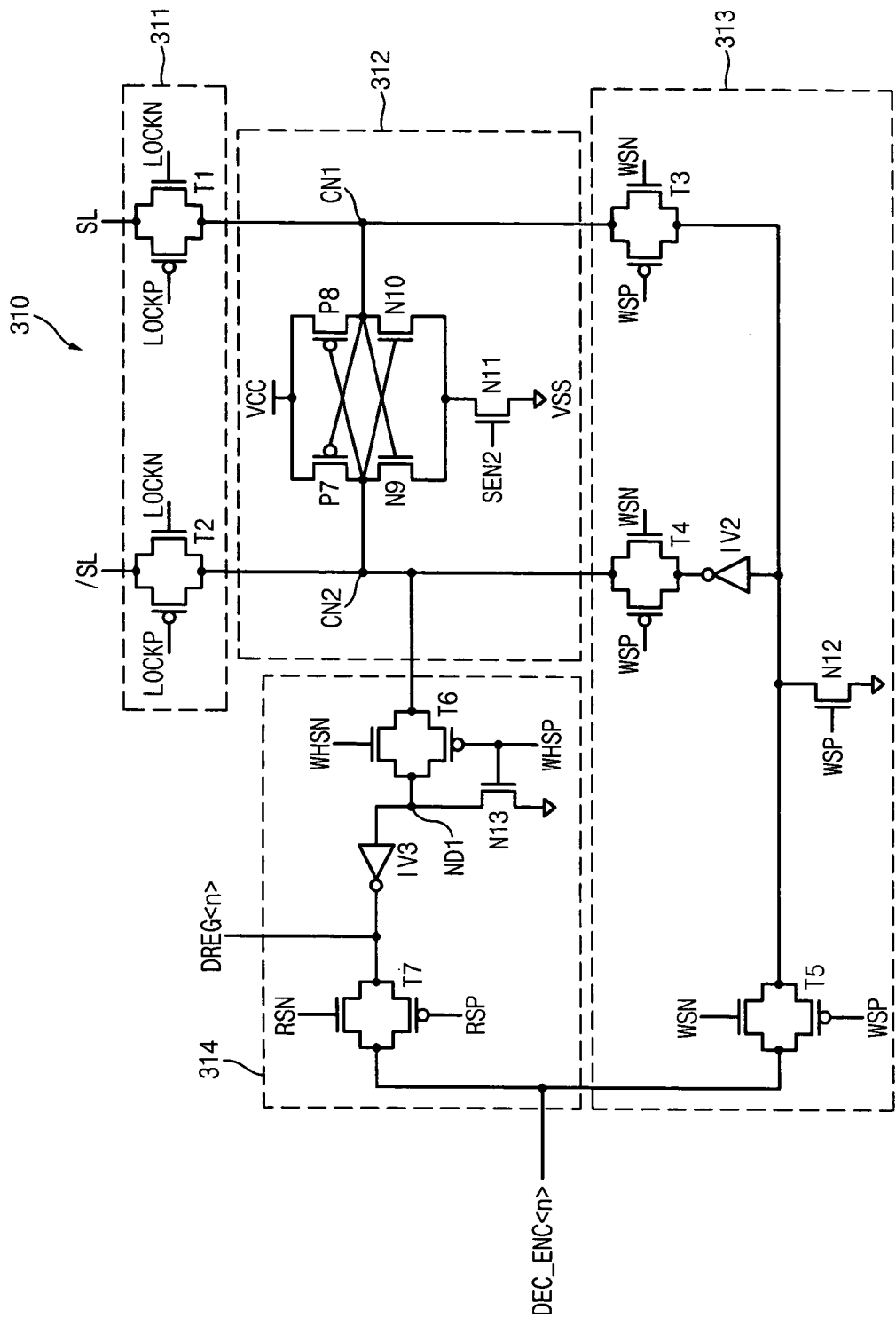
FIG. 9 is a circuit diagram of a data register of FIG. 7.

FIG. 9 is a circuit diagram of the data register 310 of FIG. 7.

The lock switching unit 311 comprises transmission gates T1 and T2. The transmission gate T1 switched in response to lock signals LOCKN/LOCKP outputs an output signal from the node SL into a node CN1 of the data latch unit 312. The transmission gate T2 switched in response to the lock signals LOCKN/LOCKP outputs an output signal from a node /SL into a node CN2 of the data latch unit 312.

The voltage change rate of the main bitline MBL is different depending on the voltage level of the sub bitline SBL, and a data voltage level of the common data bus unit 500 reaches a sensing critical value at a different time. When voltage levels of data high and low transmitted into the common data bus unit 500 reach sensing critical values, the data register 310 generates the lock signals LOCKN/LOCKP.

The data latch unit 312 comprises PMOS transistors P7 and P8 cross-coupled, NMOS transistors N9 and N10 cross-coupled, and an NMOS transistor N11. When the sensing control signal SEN2 is activated, the NMOS transistor N11 is turned on to activate a latch circuit, thereby latching data applied from the lock switching unit 311 or the data input regulator 313.

The data input regulator 313 comprises transmission gates T3~T5, an inverter IV2 and an NMOS transistor N12. The transmission gate T5 outputs a coding signal DEC_ENC<n> into the inverter IV2 in response to write control signals WSN and WSP. When the write control signal WSP is enabled, the NMOS transistor N12 is turned on to pull down an input terminal of the inverter IV2. The transmission gate T3 outputs an output signal from the transmission gate T5 into the node CN1 in response to the write control signals WSN and WSP. The transmission gate T4 outputs an output signal from the inverter IV2 into the node CN2 in response to the write control signals WSN and WSP.

The data output regulator 314 comprises transmission gates T6 and T7, an NMOS transistor N13 and an inverter IV3. The transmission gate T6 outputs an output signal from the node CN2 into a node ND1 in response to control signals WHSN and WHSP. IF the controls signal WHSN is activated, an output signal from the data latch unit 312 is outputted into the node ND1.

When the control signal WHSP is activated, the NMOS transistor N13 pulls down the node ND1 to a low level. The transmission gate T7 outputs an output signal from the node ND1 inverted by the inverter IV3 as a decoding signal DEC_ENC<n> into the encoder 340 in response to the read control signals RSN and RSP. Here, in restore of data, an output signal from the inverter IV3 is outputted as a data register signal DREG<n> into a D/A converter.

Figure 10:
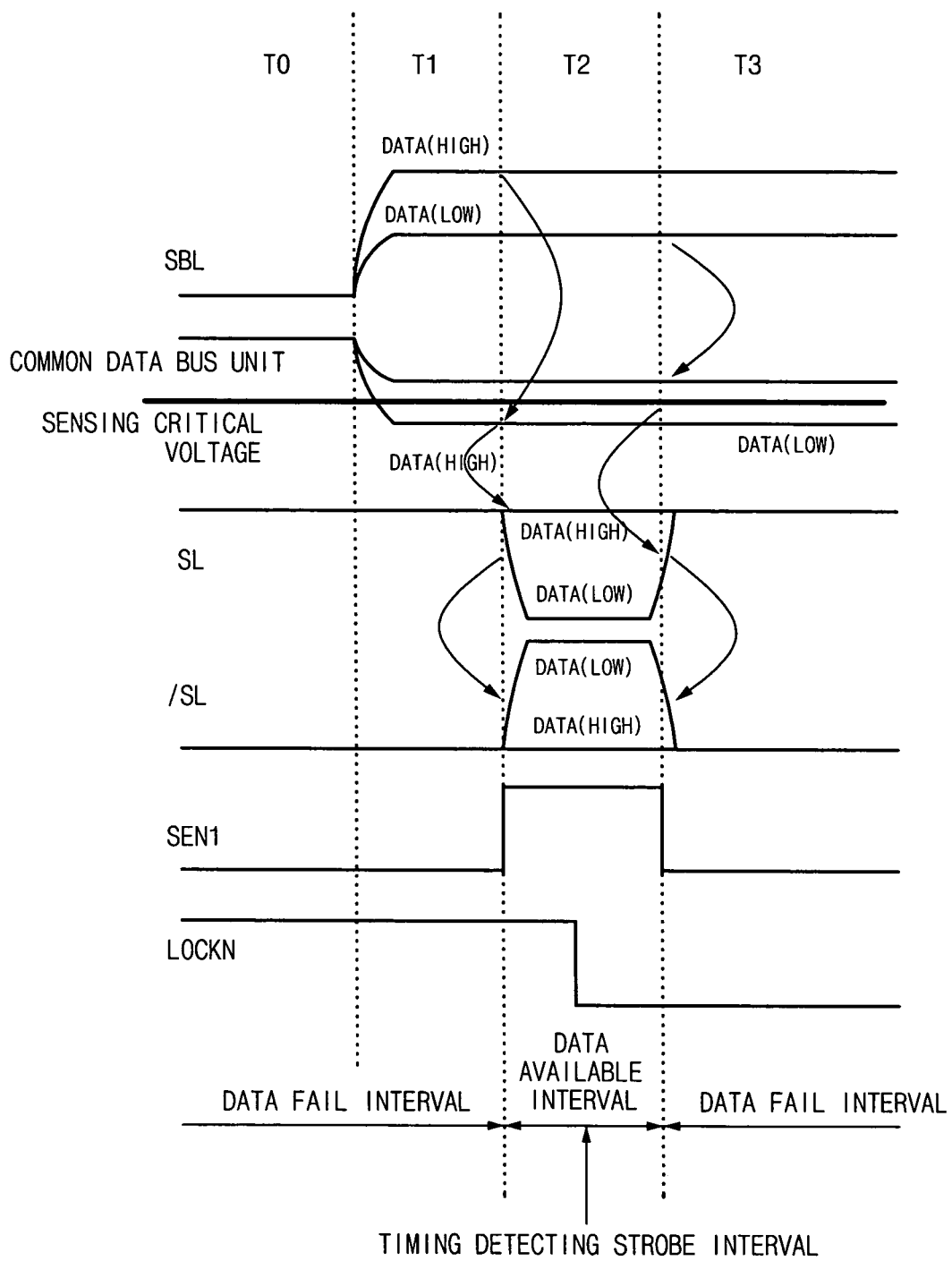
FIG. 10 is a timing diagram illustrating the operation of the sense amplifier of FIG. 7.

FIG. 10 is a timing diagram illustrating the operation of the sense amplifier 302 of FIG. 7.

In an interval T0, a wordline WL and a plateline PL are inactivated, the main bitline MBL and the common data bus unit 500 are precharged to a high level. Here, the sub bitline SBL is precharged to a low level, and the node SL is precharged to a high level by the sensing pull-up control signal SPU. The sensing control signal SEN1 is kept disabled.

In an interval T1, if cell data are read, a sensing voltage level of the sub bitline SBL is determined depending on a value of the sensed data. Voltages of the main bitline MBL and the common data bus unit 500 precharged to a high level depending on a sensing voltage of the sub bitline SBL are pulled down. Here, the amount of current flowing in the NMOS transistor N3 is differentiated depending on the sensing voltage of the sub bitline SBL. As a result, the change rage of the sensing voltage of the main bitline MBL and the common data bus unit 500 are differentiated.

When the sensing voltage of the sub bitline SBL is "high", the sensing voltage of the common data bus unit 500 is rapidly reduced to the sensing critical voltage in an interval T2. However, when the sensing voltage of the sub bitline SBL is "low", the sensing voltage of the common data bus unit 500 is slowly reduced than data "high" to the sensing critical voltage in an interval T3.

Data of the nodes SL and /SL of the sense amplifier unit 302 are divided into data "high" and "low" in the interval T2. If the data of the nodes SL and /SL are detected for the interval T2 as a timing detecting strobe interval, available data of the common data bus unit 500 can be obtained. In the interval T2, the sensing voltage of the common data bus unit 500 is higher or lower than the sensing critical voltage depending on values of the cell data. As a result, the PMOS transistor P5 or the NMOS transistor N7 of the sense amplification unit 302 are selectively turned on, the values of the nodes SL and /SL are divided into data "high" and "low".

When the sensing control signal SEN1 is at a high level, the data of the nodes SL and /SL detected by the sense amplifier unit 302 are stored in the data latch unit 312 by the lock signals LOCKN/LOCKP. Thereafter, data stored in the data latch unit 312 are outputted as decoding signals DEC_ENC<n> or data register signals DREG<n> through the data output regulator 314.

Figure 11:
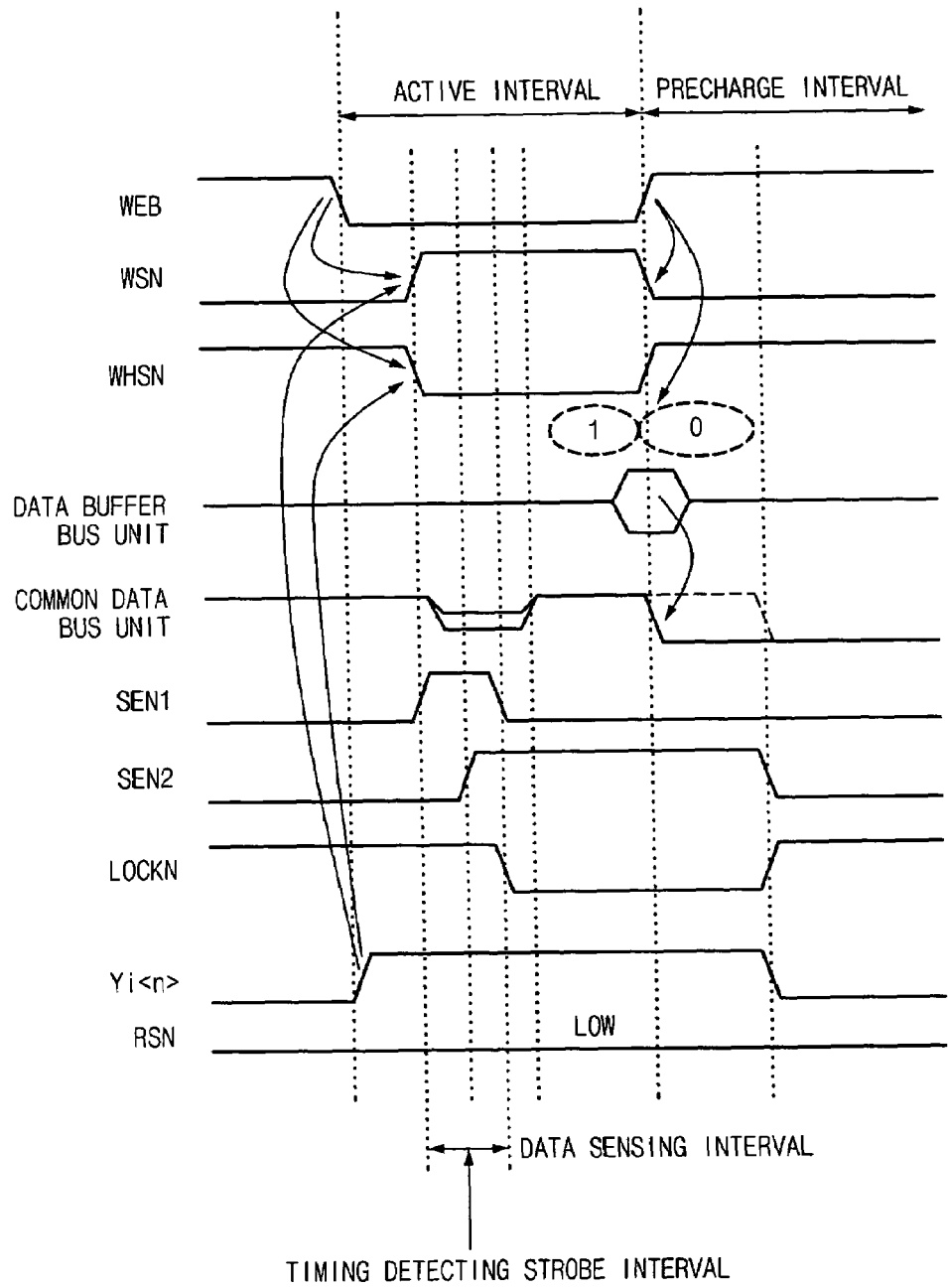
FIGS. 11 and 12 are timing diagrams illustrating the write operation of the data register of FIG. 7.

FIG. 11 is a timing diagram illustrating the write operation of the data register array unit 300 of FIG. 1 when a selected column operates.

In the active mode, the write enable signal WEB is activated, and the column selecting decoding signal Yi<n> is activated. As the write control signal WSN becomes at a high level, and the control signal WHSN becomes at a low level.

In a data sensing interval, after the sensing control signal SEN1 is activated, the sensing control signal SEN2 is activated, and the sensed data are latched in the data latch unit 312. Here, the latched sensing data are not transmitted into the common data bus unit because the control signal WHSN is inactivated.

If the sensing control signal SEN1 is inactivated, the lock signal LOCKN is also inactivated to prevent the sensed data from being transmitted into the data latch unit 312.

If data to be written in the data buffer bus unit 200 are applied, the corresponding data are latched in the data latch unit 314 through the data input regulator 313. If the control signal WHSN is activated, the latched data are outputted as data register signals DREG<n>. Here, the read control signal RSN is maintained at a low level.

Figure 12:
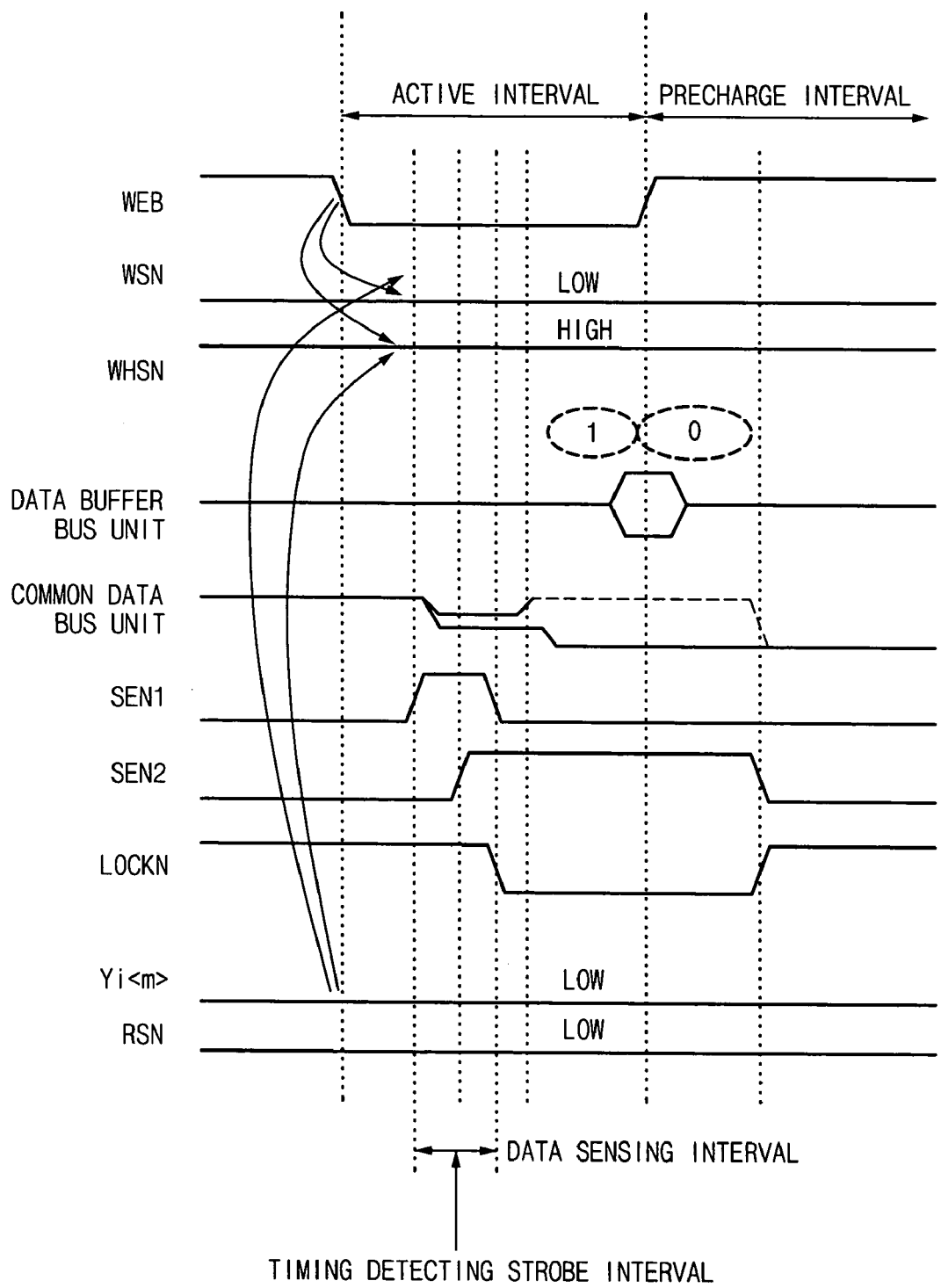

FIG. 12 is a timing diagram illustrating the write operation of the data register array unit 300 of FIG. 1 when an unselected column operates.

When a column is not selected, a restore operation is performed even though an external command is a write command. When the write enable signal WEB is activated, the write control signal WSN is maintained at a low level and the control signal WHSN is maintained at a high level. As a result, write data of the data buffer bus unit 200 are not transmitted into the data latch unit 312.

Then, the sensed data are stored in the data latch unit 312 and outputted into the common data bus unit 500, and the unselected column data operate into a restore mode.

Figure 13:
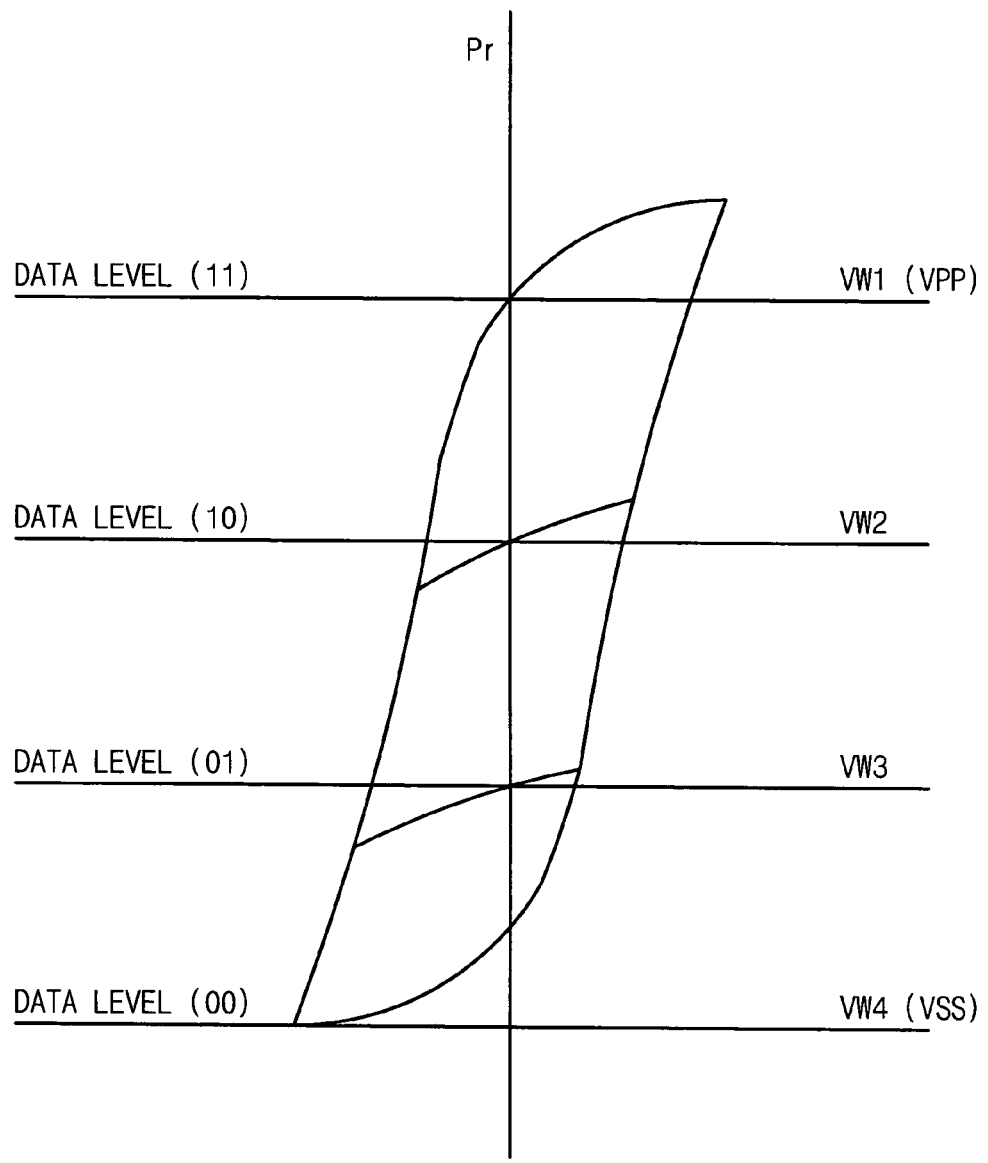
FIGS. 13 and 14 are diagrams illustrating the multi-data level.
Figure 14:
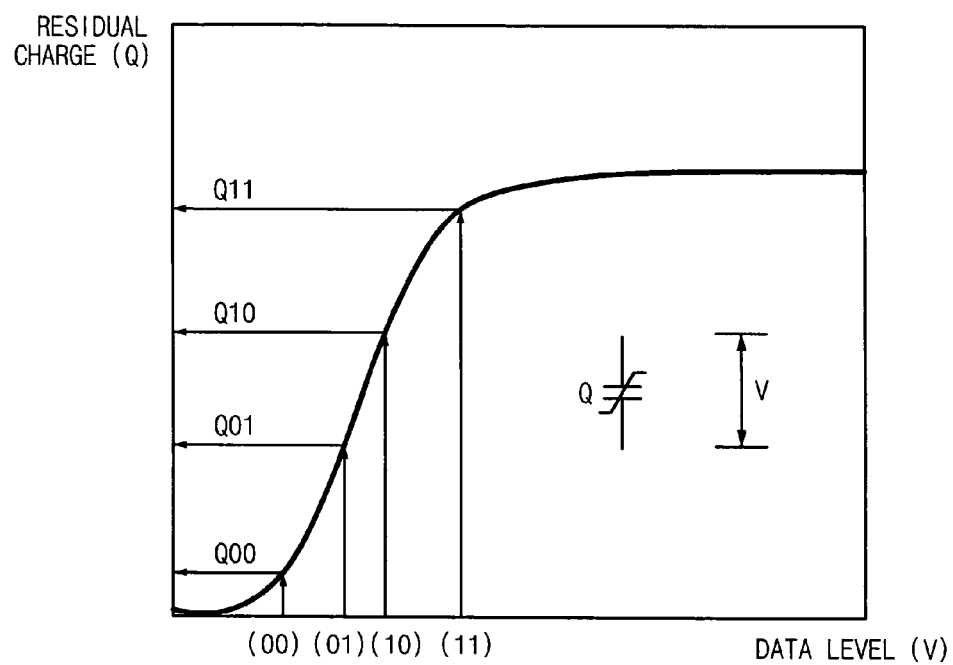

FIGS. 13 and 14 are diagrams illustrating a 2 bit recording level according to an embodiment of the present invention.

$4(2^2)$ level data is required to store 2 bits in a memory cell. That is, data levels of 00, 01, 10 and 11 are required. Thus, in order to store data of four levels in a cell, a voltage level is divided into VW1 (VPP), VW2, VW3 and VW4 (VSS), and stored.

Hereinafter, the write operation of 2 bit data is described.

If a VW1(VPP) voltage is applied to a cell while the plate line PL is at the ground voltage VSS level, hidden data "1" is written in all cells.

Next, when a pumping voltage VPP is applied to the plateline PL, a voltage VW2 is applied to the sub bitline SBL and the main bitlines MBL to store a data level 10. As a result, a voltage VW1–VW2 is applied to the plateline PL and the sub bitline SBL. That is, the charge initially stored in the cell is reduced to that corresponding to the voltage VW1–VW2. Thus, a data level 11 transits to the data level 10.

Thereafter, data levels 01 and 00 are stored in the cell by applying different voltages VW3 and VW4 to the sub bitline SBL and the main bitline MBL.

Figure 15:
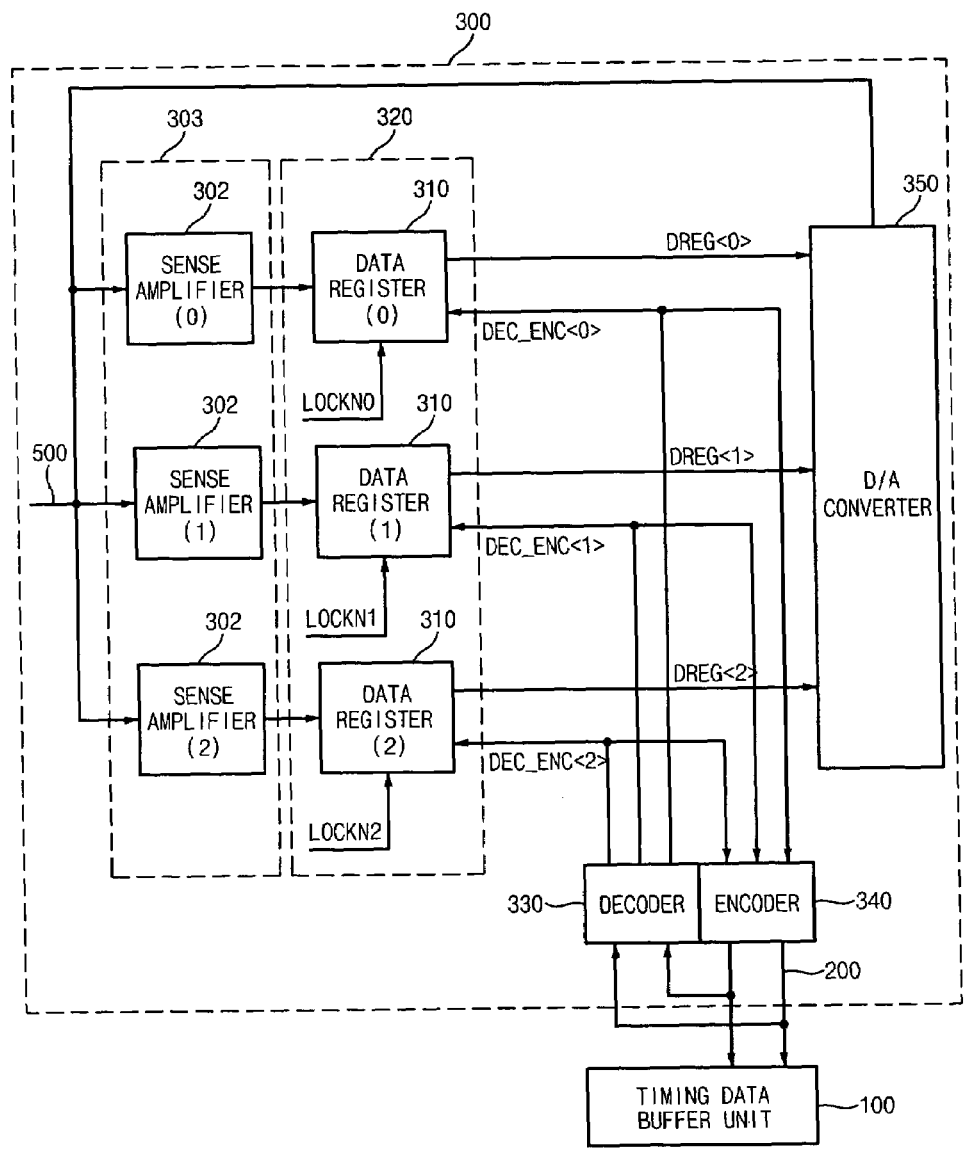
FIG. 15 is a diagram of the timing data register array unit of FIGS. 1 and 2.

FIG. 15 is a diagram of the timing data register array unit 300 of FIGS. 1 and 2.

The timing data register array unit 300 comprises a sense amplifier array unit 303, a data register array unit 320, a decoder 330, an encoder 340 and a D/A(Digital/Analog) converter 350.

The sense amplifier array unit 303 comprises a plurality of sense amplifiers 302 described in FIG. 8. The sense amplifier array unit 303 sets a plurality of sensing critical voltages by regulating the sensing size of the PMOS transistor P5 and the NMOS transistor N7 in order to sense read data applied through the common data bus unit 500 as a plurality of data levels.

The sense amplifier unit 302 is set to have different sensing critical voltages. That is, the lowest sensing critical voltage is set in the sense amplifier (0) 302, the second lowest sensing critical voltage is set in the sense amplifier (1) 302, and the highest sensing critical voltage is set in the sense amplifier (2) 302.

Data 11 and 10 can be determined in the sense amplifier (0) 302, data 10 and 01 in the sense amplifier (1) 302, and data 01 and 00 in the sense amplifier (2) 302.

The data register array unit 320 comprising a plurality of data registers 310 described in FIG. 7 latches a plurality of sensing data levels applied from the sense amplifier array unit 303 in response to lock signals LOCKN0~LOCKN2. The data register array unit 320 outputs data register signals DREF<0:2> into the D/A converter 350 in response to the control signal WHSN and the read control signal RSN to restore read data. The data register array unit 320 stores coding signals DEC_ENC<0:2> applied through the decoder 330, and outputs the coding signals DEC_ENC<0:2> stored in the encoder 340.

The timing data register array unit 300 comprises three sense amplifiers 302 to process 2 bit data. The timing data register array unit 300 compares four data sensing levels with three sensing critical voltages, and stores the comparison results in the three data registers 310.

The decoder 330 decodes input data applied from the timing data buffer unit 100 through the data buffer bus unit 200, and outputs the coding signals DEC_ENC<0:2> into the data register array units 320. The encoder 340 encodes the coding signals DEC_ENC<0:2> applied from the data register array unit 320, and outputs the encodes signals into the timing data buffer unit 100 through the data buffer bus unit 200.

The D/A converter 350 converts a plurality of data register signals DREG<0:2> applied from the data register array unit 340 into analog signals, and outputs the converted signals into the common data bus unit 500.

Figure 16:
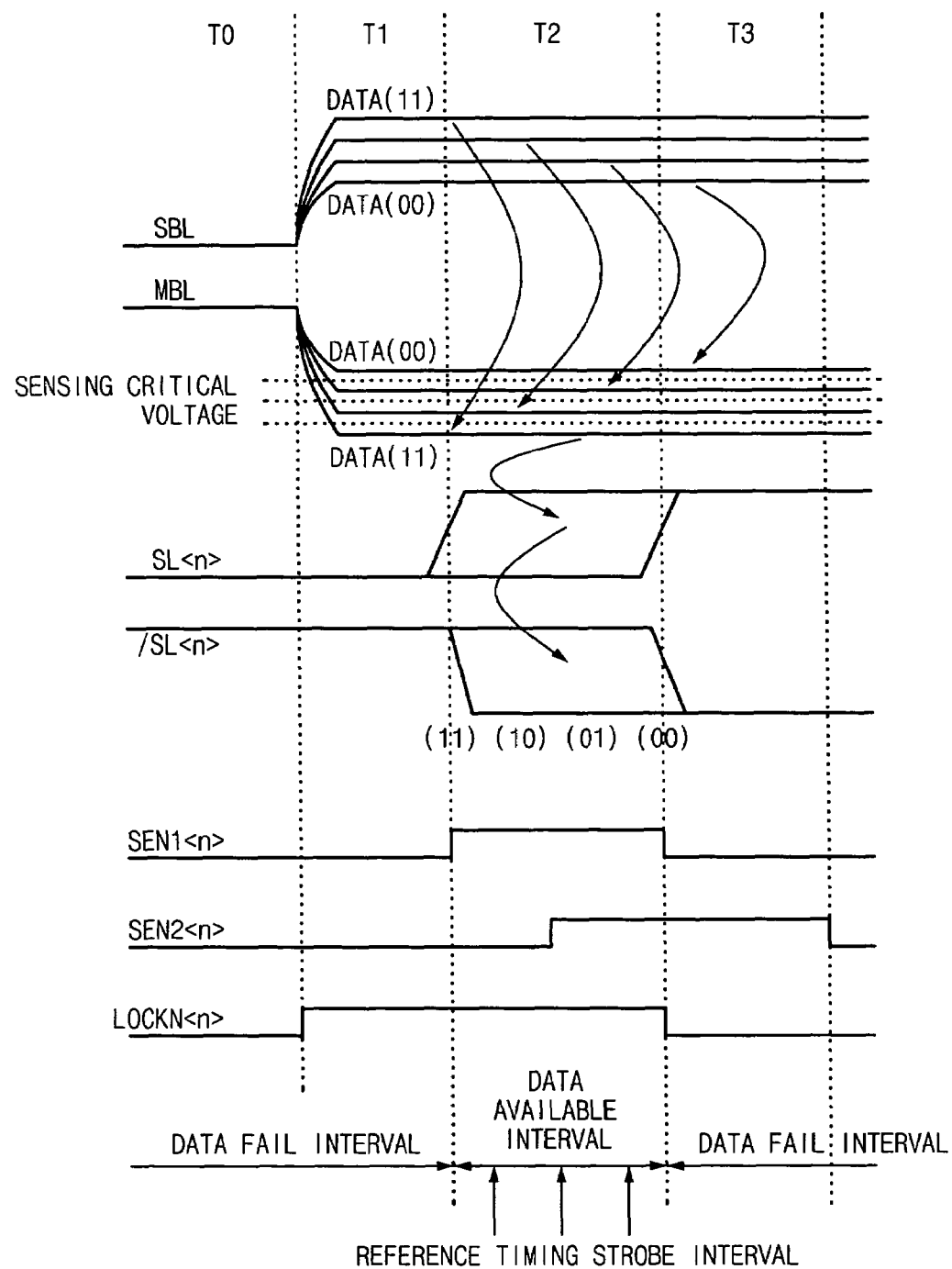
FIG. 16 is a timing diagram illustrating the operation of the timing data register array unit of FIG. 15.

FIG. 16 is a timing diagram illustrating the operation of the timing data register array unit 300 of FIG. 15.

In an interval T1, lock signals LOCKN<n> are enabled, and a plurality of cell sensing data 00,01,10 and 11 are applied to the sub bitline SBL. A plurality of data sensing levels in the sub bitline SBL are separated into a plurality of main bitline MBL signals. The plurality of sensing levels applied to the main bitline MBL are compared with a plurality of sensing critical voltages preset in the sense amplifier 302.

In an interval T2, if the sensing control signal SEN1 is enabled, the sense amplifier 302 is activated, and a plurality of cell sensing data 11,10,01 and 00 having a plurality of voltage levels are outputted through the node SL and /SL.

If the sensing control signal SEN2 is enabled, the data latch unit 312 is activated, and read data having a plurality of sensing levels are continuously stored in the data latch unit 312. As a result, for the reference timing strobe interval, a plurality of cell sensing data 00,01,10 and 11 which reach a plurality of sensing critical voltages have different voltage values in the main bitline MBL.

In the interval T2, while the sensing control signal SEN2 is enabled, a plurality of data sensed in the sense amplifier 302 are stored in the three data registers 310. If the lock LOCKN<n< transits to a low level, the lock switching unit 311 is disconnected, and read data are no longer inputted into the data latch unit 312. When the clock signal LOCKN is disabled and the reference timing strobe is applied, the previously stored data in the data latch unit 312 can be continuously maintained.

Thereafter, in an interval T3, if the sensing control signal SEN1 and the lock signal LOCKN transit to a low level, the sense amplifier unit 302 and the lock switching unit 311 are inactivated. As a result, the node SL is enabled to a high level regardless of voltage levels of a plurality of cell data.

Figure 17:
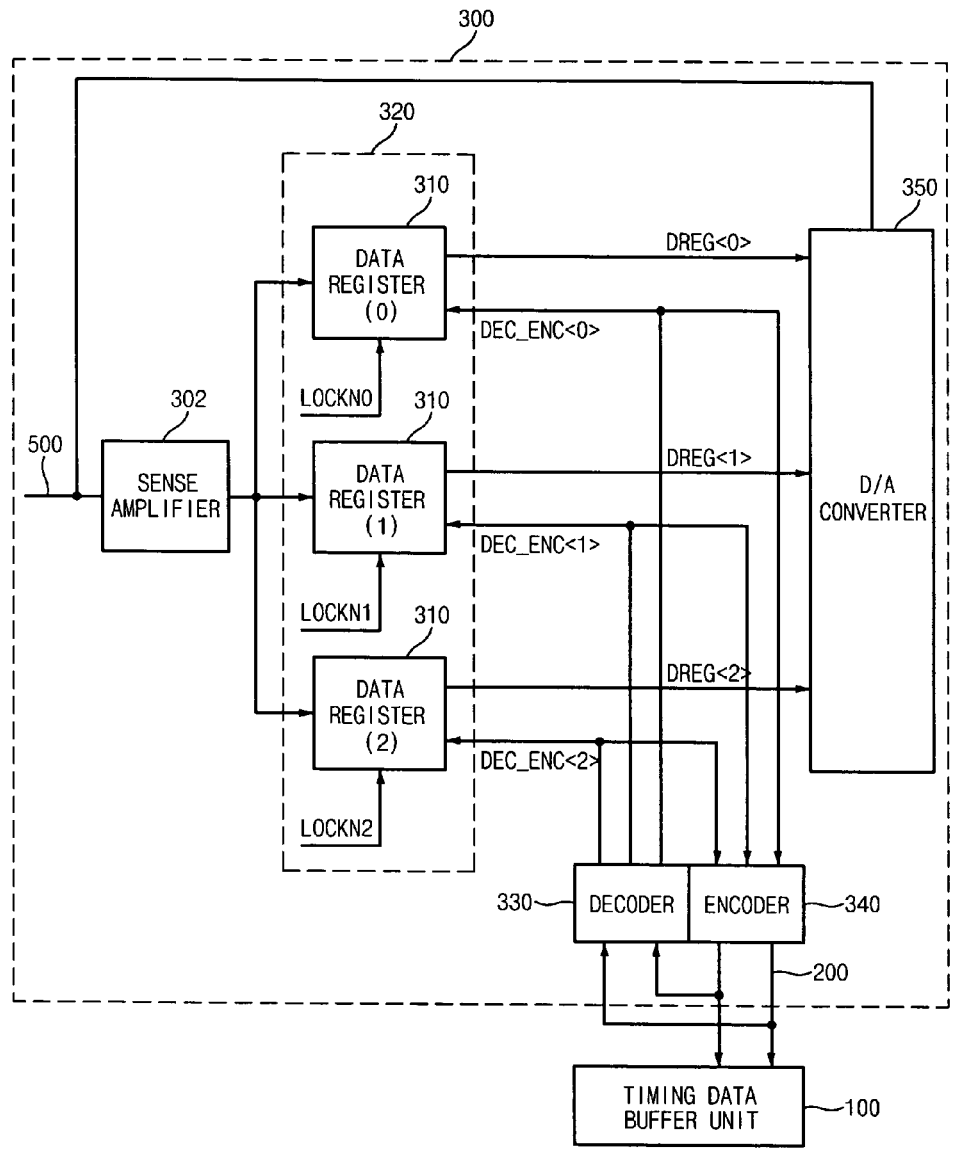
FIG. 17 shows another example of the timing data register array unit of FIGS. 1 and 2.

FIG. 17 shows another example of the timing data register array unit 300 of FIGS. 1 and 2.

When compared with FIG. 15, one sense amplifier 302 is used in the timing data register array unit 300 of FIG. 17. As a result, the sensing critical voltage of the sense amplifier 302 is set to have one value.

The timing data register array unit 300 requires data processing of 4 levels to process 2 bit data. Four data sensing levels are compared in one sensing critical voltage with difference timing references, and the comparison results are stored in the three data registers 310. In one sensing critical voltage, a plurality of cell sensing data levels are detected by regulating timing of the lock signal LOCKN controlled by the difference reference timing.

Figure 18:
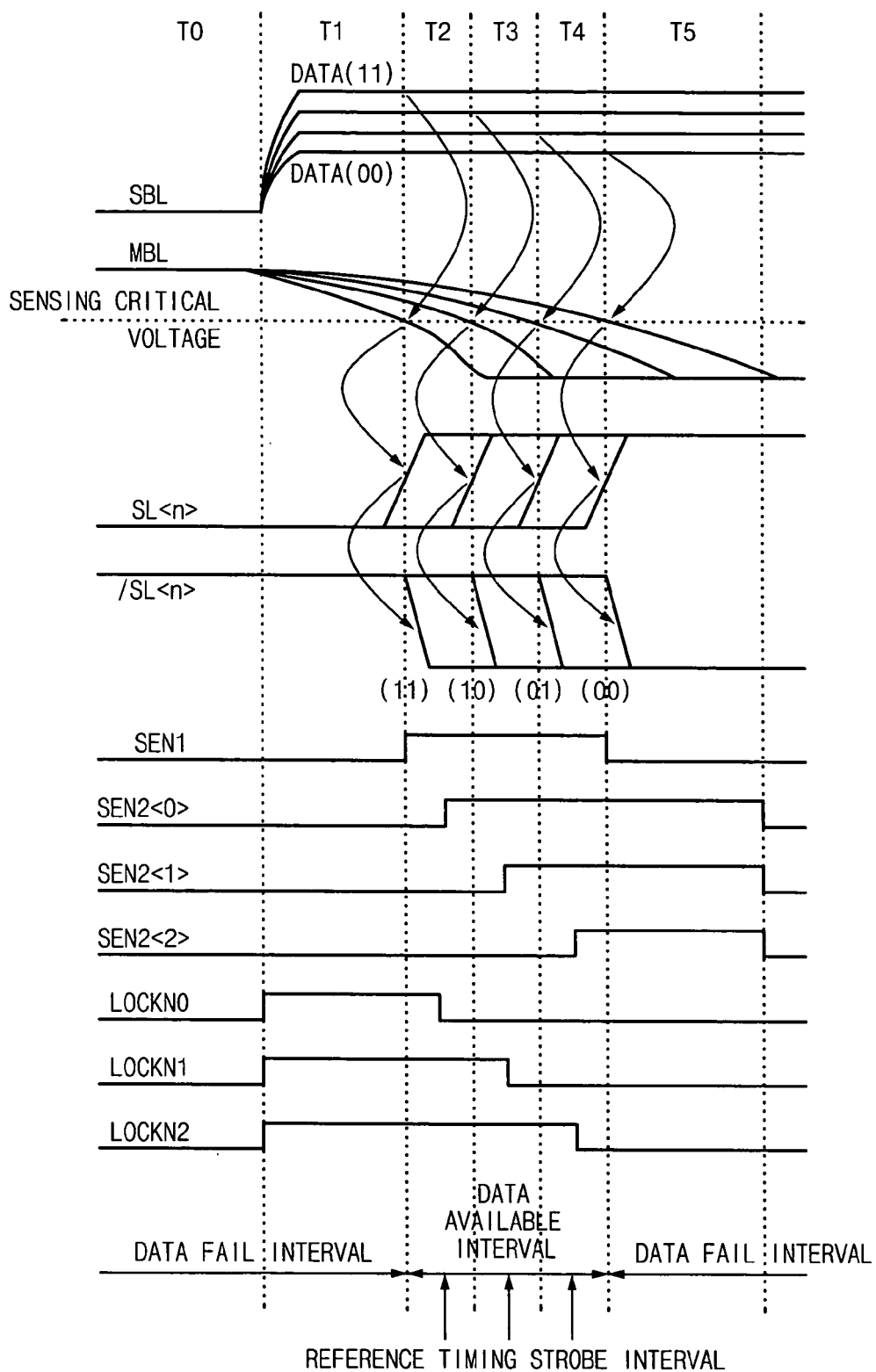
FIG. 18 is a timing diagram illustrating the timing data register array unit of FIG. 17.

FIG. 18 is a timing diagram illustrating the operation of the timing data register array unit 300 of FIG. 17.

For reference timing strobe intervals T2~T4, the sensing control signal SEN1 is maintained at a high level, thereby activating the sense amplifier 302. In the interval T2, the sensing control signal SEN2<0> becomes at a high level and the lock signal LOCKN0 becomes at a low level. As a result, data 11 and 10 are determined and stored in the data register (0) 310.

In the interval T3, the sensing control signal SEN2<1> becomes at a high level, and the lock signal LOCKN1 becomes at a low level. As a result, data 10 and 01 are determined, and stored in the data register (1) 310. In the interval T4, the sensing control signal SEN2<2> becomes at a high level, and the lock signal LOCKN2 becomes at a low level. As a result, data 01 and 00 are determined, and stored in the data register (2) 310.

Figure 19:
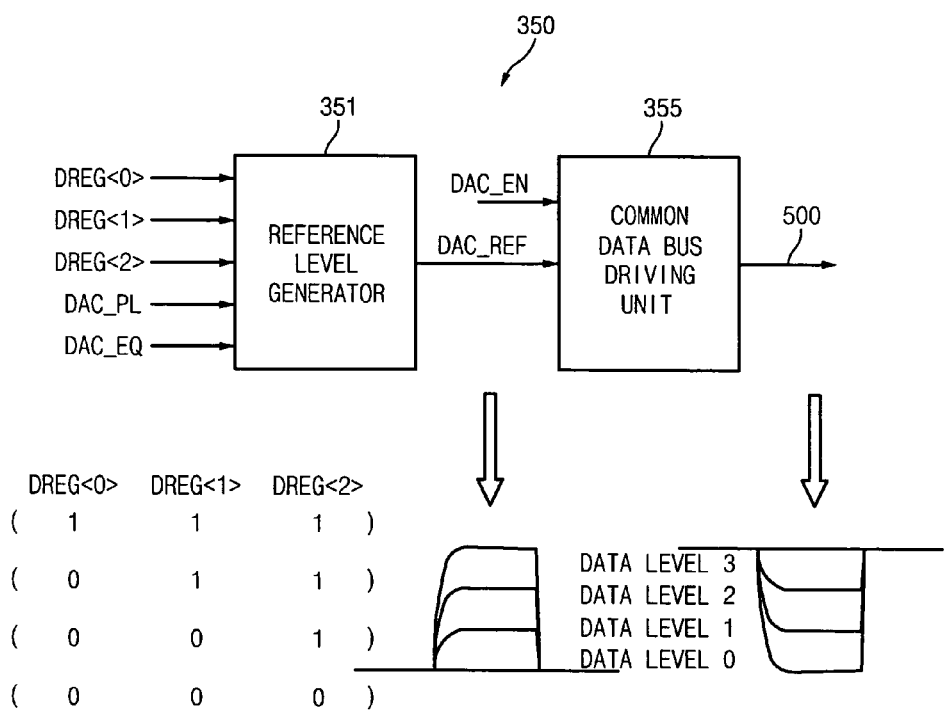
FIG. 19 is a diagram of a D/A converter of FIG. 17.

FIG. 19 is a diagram of the D/A converter 350 of FIGS. 15 and 17.

The D/A converter 350 comprises a reference level generator 351 and a common data bus driving unit 355.

The reference level generator 351 outputs a reference level signal DAC_REF in response to a plurality of data register signals DREG<0:2> applied from the data register array unit 320, a plateline control signal DAC_PL and an equalizing signal DAC_EQ. The reference level generator 351 generates 4 cell recording voltage levels using three data register signals DREG<0:2> to process 2 bit data.

The reference level generator 351 outputs the reference level signal DAC_REF having a data level "3" when the data register signals DREG<0:2> are all "1". The reference level generator 351 outputs the reference level signal DAC_REF having a data level "2" when the data register signal DREF<0> is "0" and the other data register signals DREF<1> and DREF<2> are "1".

The reference level generator 351 outputs the reference level signal DAC_REF having a data level "1" when the data register signal DREF<2> is "1" and the data register signals DREF<0> and DREF<1> are "0". The reference level generator 351 outputs the reference level signal DAC_REF having a data level "0" when the data register signals DREF<0:2> are all "0".

The common data bus driving unit 385 drives the reference level signal DAC_REF and outputs the driven signal DAC_REF into the common data bus unit 600.

Figure 20:
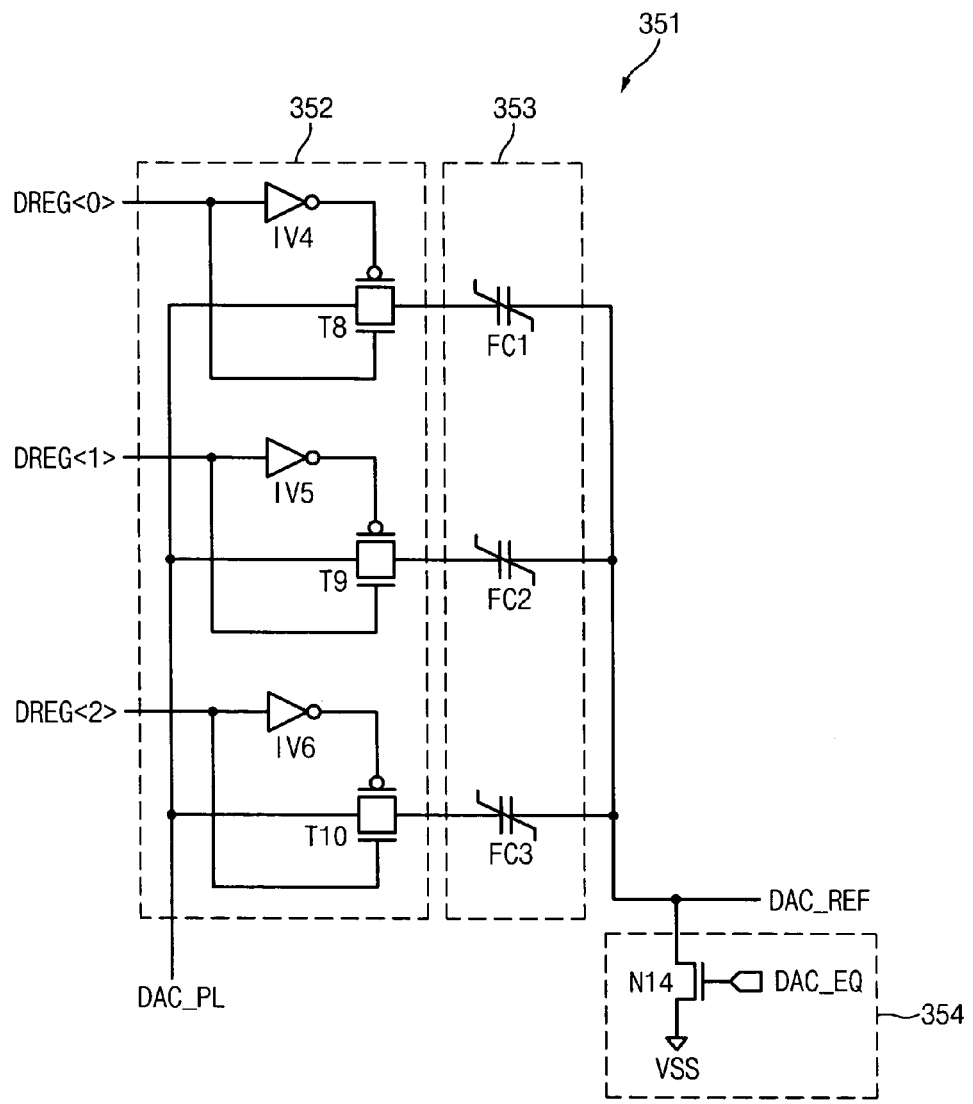
FIG. 20 is a circuit diagram of a reference level generator of FIG. 19.

FIG. 20 is a circuit diagram of the reference level generator 351 of FIG. 19.

The reference level generator 351 comprises a switching unit 352, a capacitor regulator 353 and a precharge controller 354.

The switching unit 352 comprises a plurality of inverters IV4~IV6, and a plurality of transmission switches T8~T10. The capacitor regulator 353 comprises a plurality of nonvolatile ferroelectric capacitors FC1~FC3. The precharge controller 354 comprises an NMOS transistor N14. The NMOS transistor N14, connected between a reference level signal DAC_REF output terminal and a ground voltage VSS terminal, has a gate to receive an equalizing signal DAC_EQ.

The inverters IV4~IV6 in the switching unit 352 invert a plurality of data register signals DREG<0:2> applied from the data register array unit 320. The transmission gates T8~T10 selectively outputs a plateline control signal DAC_PL in response to the plurality of data register signals DREG<0:2>.

The nonvolatile ferroelectric capacitors FC1~FC3 controls a data voltage level of the reference level signal DAC_REF by selectively regulating the size of the capacitor outputted in response to output signals from the transmission gates T8~T10, respectively.

During the precharge interval, the equalizing signal DAC_EQ becomes at a high level, and the NMOS transistor N14 is turned on to precharge the reference level signal DAC_REF to a low level.

Figure 21:
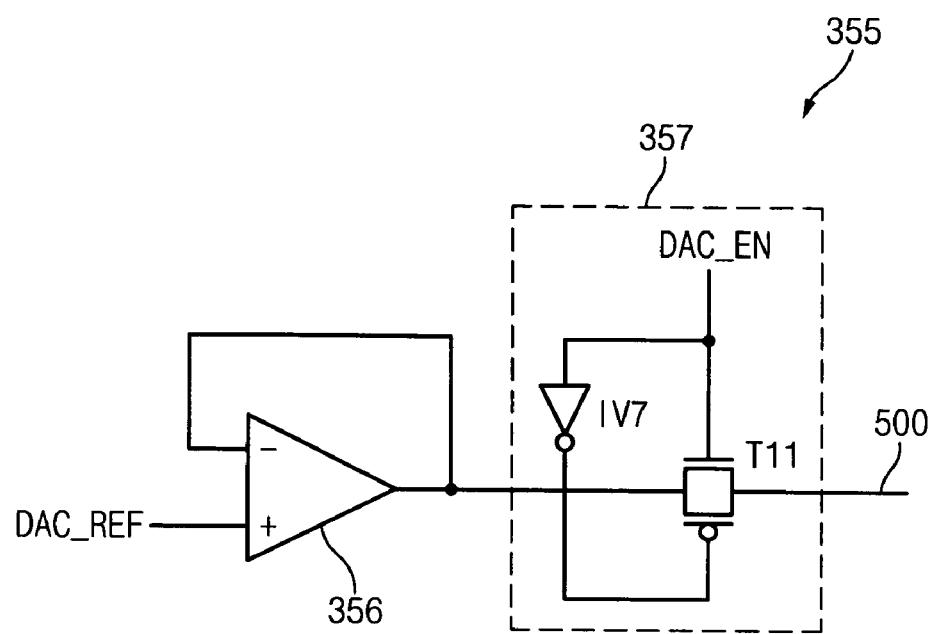
FIG. 21 is a circuit diagram of a common data bus driving unit of FIG. 19.

FIG. 21 is a circuit diagram of the common data bus driving unit 355 of FIG. 19.

The common data bus driving unit 355 comprises a buffer 356 and a driving unit 355. The buffer 356 amplifies a current driving capacity of the reference level signal DAC_REF. Here, the voltage of the reference level signal DAC_REF is the same as that of the common data bus unit 500.

The driving unit 357 comprises an inverter IV7 and a transmission gate T11. The driving unit 357 selectively outputs an output signal from the buffer 356 into the common data bus unit 500 in response to the driving enable signal DAC_EN enabled only in the write mode.

Figure 22:
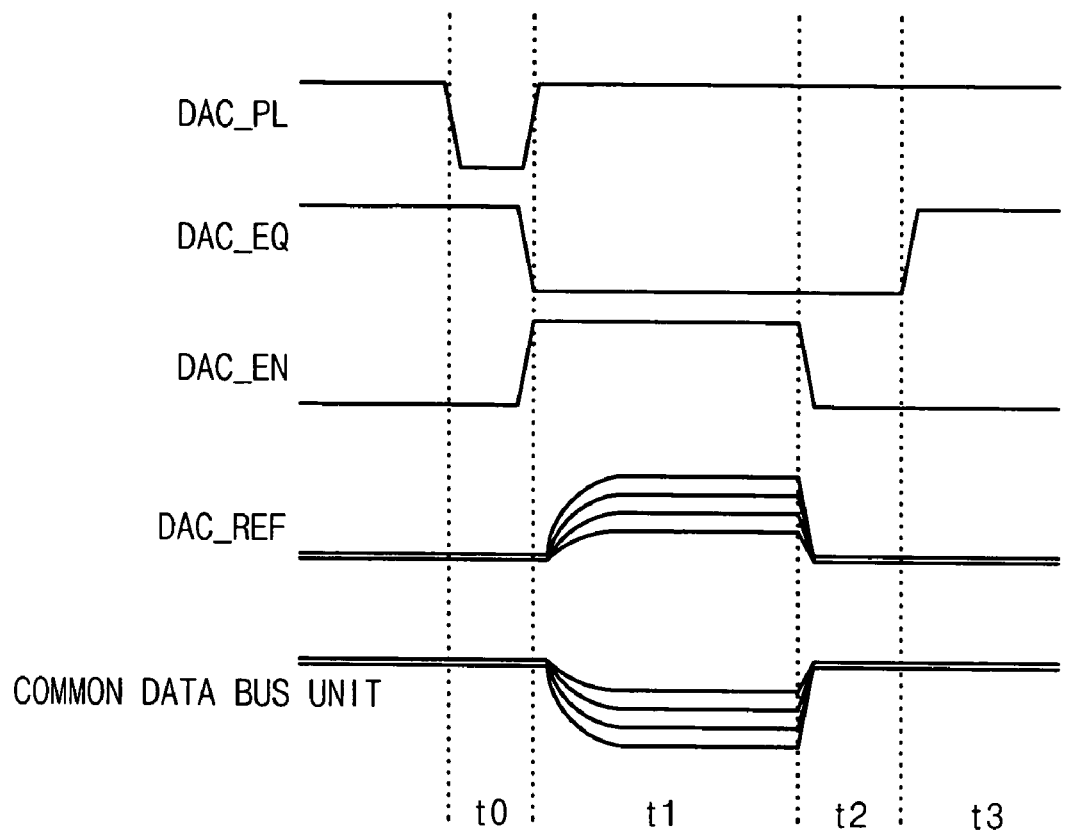
FIG. 22 is a timing diagram of the D/A converter of FIG. 17.

FIG. 22 is a timing diagram of the D/A converter 350 of FIGS. 15 and 17.

In an interval t0, the plateline control signal DAC_PL transits to a low level, and is maintained at a high level after an interval t1. As a result, noise charge is removed of the capacitor regulator 353. In addition, the equalizing signal DAC_EQ becomes at a high level, thereby initializing the capacitor regulator 353 to a low level.

When the interval t1 starts, the equalizing signal DAC_EQ transits to a low level. The driving enable signal DAC_EN is enabled during the write mode of the interval t1 in order to write data in the cell array block 400 through the common data bus unit 500. The voltage level of the reference level signal DAC_REF is determined in response to the plurality of data register signals DREG<0:2>.

In other words, when the plurality of data register signals DREG<0:2> are all at a high level, the voltage level of the plateline control signal DAC_PL is applied to the three nonvolatile ferroelectric capacitors FC1~FC3 of the capacitor regulator 353. As a result, the reference level signal DAC_REF is outputted with the highest voltage level.

On the other hand, when the plurality of data register signals DREG<0:2> are all at a low level, the voltage level of the plateline control signal DAC_PL is not applied to the nonvolatile ferroelectric capacitors FC1~FC3 of the capacitor regulator 353. As a result, the reference level signal DAC_REF is outputted with the lowest voltage level.

In the initial operation, since the common data bus unit 500 is precharged to a high level, the reference level signal DAC_REF is written in the write mode.

Figure 23:
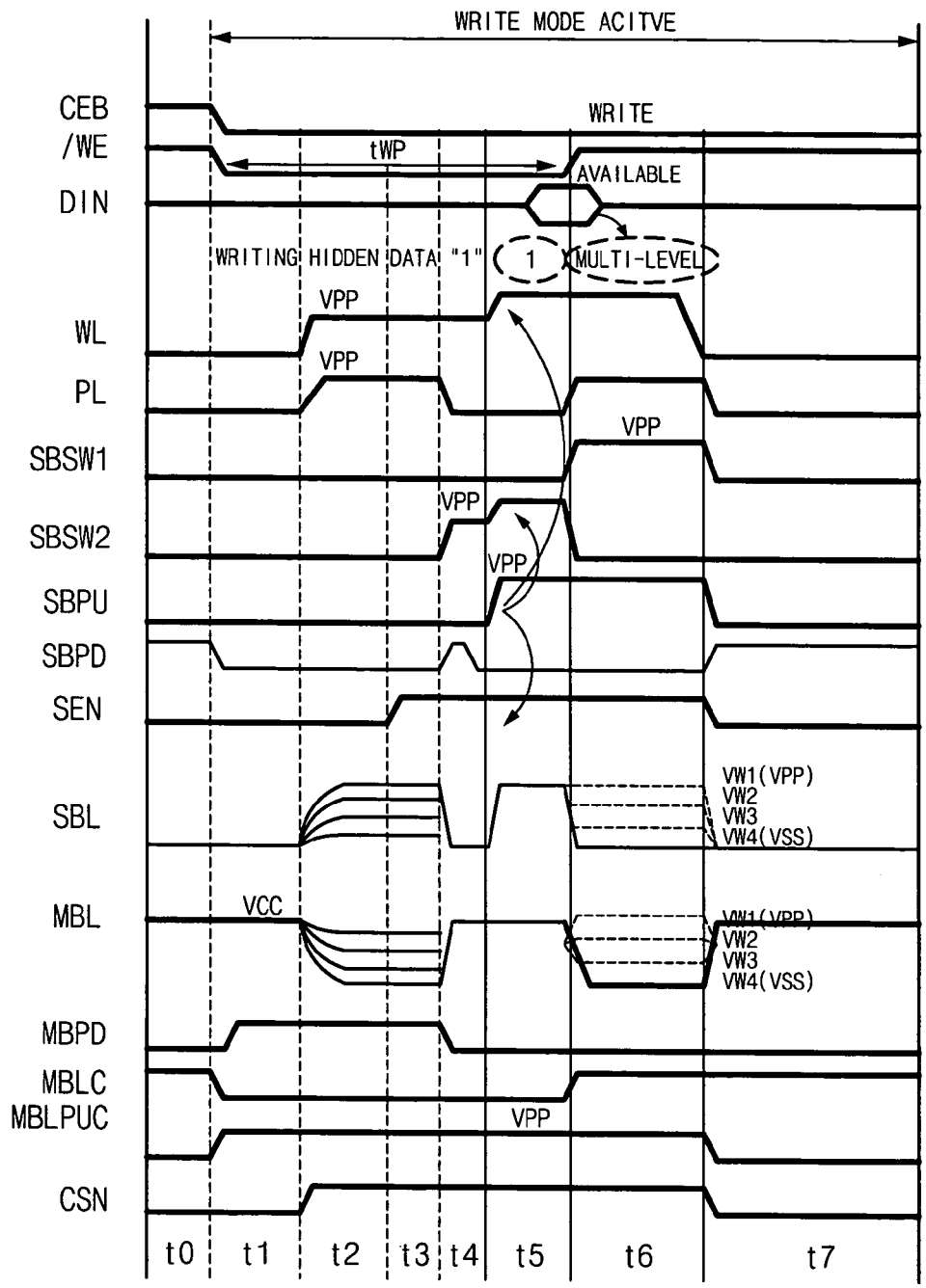
FIG. 23 is a timing diagram illustrating the write operation of a nonvolatile ferroelectric memory device having a multi-bit control function.

FIG. 23 is a timing diagram illustrating the write operation of a nonvolatile ferroelectric memory device having a multi-bit control function.

When an interval t1 starts, if the chip selective signal CSB and the write enable signal /WE are disabled to a low level, the write operation becomes active. Here, the sub bitline pull-down signal SBPD and the main bitline control signal MBLC are disabled to a low level. The main bitline pull-up control signal MBLPUC is enabled to a high level.

Thereafter, when an interval t2 starts, if the wordline WL and the plateline PL are enabled to a pumping voltage VPP, the voltage level of the sub bitline SBL rises. Then, the column selecting signal CSN is enabled to connect the common data bus unit 500 to the main bitline MBL.

Next, when an interval t3, a data sensing interval, starts, the sense amplifier enable signal SEN is enabled to apply cell data to the main bitline MBL.

When an interval t4 starts, the plateline PL is disabled to a low level, and the sub bitline selecting signal SBSW2 is enabled to a high level. Here, the sub bitline pull-down signal SBPD is enabled to a high level, and the sub bitline SBL and the main bitline pull-down signal MBPD are disabled to a low level.

In an interval t5, hidden data "1" is written. When the interval t5 starts, the voltage of the wordline WL rises, and the sub bitline selecting signal SBSW2 is enabled to the pumping voltage VPP level in response to the sub bitline pull-up signal SBPU. As a result, the voltage level of the sub bitline SBL rises to the pumping voltage VPP level.

In an interval t6, multi-level data can be written in response to the write enable signal /WE. When the interval t6 starts, the plateline PL is enabled again. Then, the sub bitline selecting signal SWSB1 rises to the pumping voltage VPP level, and the sub bitline selecting signal SBSW2 is disabled. Here, the main bitline control signal MBLC is enabled to a high level.

Therefore, while the sub bitline selecting signal SWSB1 is at the pumping voltage VPP level, a plurality of data can be written in the memory cell depending on multi-voltages VW1~VW4 levels applied to the sub bitline SBL and the main bitline MBL.

When an interval t7 starts, the wordline WL, the plateline PL, the sub bitline selecting signal SBSW1 and the sub bitline pull-up signal SBPU are disabled. Then, the sub bitline pull-down signal SBPD is enabled, and the sense amplifier enable signal SEN is disabled. The main bitline pull-up control signal MBLPUC is disabled, and the main bitline MBL is precharged to the power voltage VCC level. Here, the column selecting signal CSN is disabled to disconnect the common data bus unit 500 to the main bitline MBL.

Figure 24:
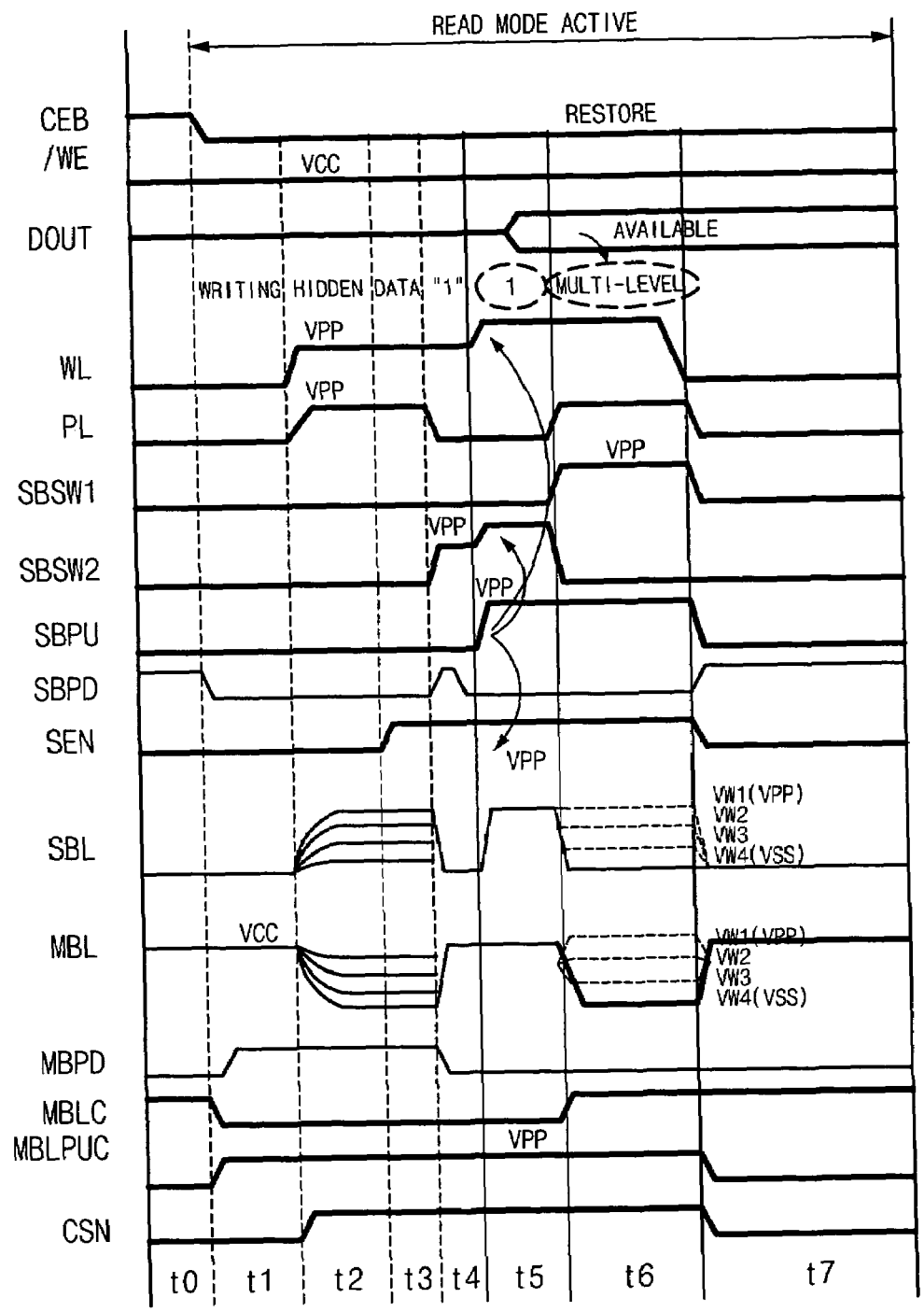
FIG. 24 is a timing diagram illustrating the read operation of a nonvolatile ferroelectric memory device having a multi-bit control function.

FIG. 24 is a timing diagram illustrating the read operation of a nonvolatile ferroelectric memory device having a multi-bit control function.

In the read mode, the write enable signal /WE is maintained at the power voltage VCC level. In the interval t2 and t3, data are sensed. In the interval t5, hidden data "1" is written, and a data output available interval is maintained after the interval t5.

The cell array block 400 does not write input data externally inputted through the timing data buffer unit 100 in the cell. Instead, the cell array block 400 restores read data stored in the timing data register array unit 300 in the cell.

Thereafter, in the interval t6, a plurality of multiple level data are restored. That is, while the sub bitline selecting signal SBSW1 is at a high level, multiple levels of the voltages VW1~VW4 are applied to the sub bitline SBL and the main bitline MBL by a feedback decoder loop. As a result, the multiple levels are restored in the memory cell.

During the interval t6, a plurality of data levels stored in the cell array block 400 are sensed, and outputted through the common data bus unit 500.

As described above, in a nonvolatile ferroelectric memory device according to an embodiment of the present invention, a plurality of data levels are detected by differentiating timing of a reference timing strobe interval using a sensing critical voltage, and a plurality of data bits are stored in a cell, thereby improving the sensing margin. Also, a plurality of data levels are detected in a timing strobe interval using a plurality of sensing critical voltages, and a plurality of data bits are stored in a cell, thereby improving the sensing margin. Since a plurality of read/written data are stored through a register, a chip having an improved access time can be obtained. In addition, a self-sensing voltage of cell data is amplified in a reference timing interval and a plurality of data voltage levels are determined on a basis of a time axis, thereby securing the margin of the sensing voltage and improving the operation speed.

What is claimed is:

1. A nonvolatile ferroelectric memory device having a multi-bit control function, comprising:
a plurality of cell array blocks for outputting a plurality of different cell data sensing voltages induced to a main bitline in a reference timing strobe interval, wherein each of the plurality of cell array blocks comprises a nonvolatile ferroelectric memory;

a timing data register array unit for comparing the plurality of cell data sensing voltages with a plurality of preset sensing critical voltages to output comparison results corresponding to a plurality of bit data, and for converting a plurality of inputted bit data or the plurality of cell data sensing voltages into analog reference level signals; and a common data bus unit, connected in common to the plurality of cell array blocks, for controlling data exchange between the plurality of cell array blocks and the timing data register array unit.

2. The device according to claim 1, wherein each of the plurality of cell array blocks comprises:

a main bitline pull-up unit for pulling up the main bitline in response to a main bitline pull-up control signal;

a main bitline sensing load unit for controlling sensing load of the main bitline in response to a main bitline control signal;

a plurality of sub cell arrays each comprising the nonvolatile ferroelectric memory; and a column selecting switch unit for selectively connecting the common data bus unit to the main bitline in response to a column selecting signal.

3. The device according to claim 1, wherein the timing data register array unit comprises:

a sense amplifier array unit for comparing a plurality of cell data sensing voltages applied from the common data bus unit with the plurality of sensing critical voltages, and for outputting a plurality of sensing data levels while a first sensing control signal is enabled;

a data register array unit for storing the plurality of sensing data levels applied from the sense amplifier array unit in response to a second sensing control signal when a lock signal is activated, and for outputting a plurality of data register signals;

a decoder for decoding input data applied from a timing data buffer unit through a data buffer bus unit, and for outputting a plurality of coding signals into the data register array unit;

an encoder for encoding the plurality of coding signals applied from the data register array unit, and for outputting the encoded signals into the data buffer bus unit; and a D/A converter for converting the plurality of data register signals into analog reference level signals, and for outputting the converted signals into the common data bus unit.

4. The device according to claim 3, wherein the timing data register array unit further comprises a bus pull-up unit for pulling up the common data bus unit to a power voltage in response to a data bus pull-up control signal.

5. The device according to claim 3, wherein the sense amplifier array unit comprises a plurality of sense amplifiers for comparing the plurality of cell data sensing voltages depending on a logic threshold voltage, wherein each of the plurality of sense amplifiers has the preset sensing critical voltage.

6. The device according to claim 5, wherein each of the plurality of sense amplifiers comprises:

a first driver for supplying a ground voltage when the first sensing control signal is activated;

a second driver and a third driver for comparing the plurality of cell data sensing voltages with the level of the preset logic threshold voltage, and selectively outputting the ground voltage or power voltage into a first node; and a fourth driver for precharging the first node to the power voltage when the first sensing control signal is inactivated and a sensing pull-up control signal is enabled.

7. The device according to claim 3, wherein the data register array unit comprises a plurality of data registers, wherein each of the plurality of data registers comprises:

a lock switching unit for outputting a sensing data level applied from the sense amplifier array unit when the lock signal is activated;

a data latch unit for storing the sensing data level applied from the lock switching unit when the second sensing control signal is activated;

a data input regulator for outputting a coding signal applied from the data buffer bus unit into the data latch unit when a write control signal is activated; and a data output regulator for outputting a data register signal into the D/A converter when a restore control signal is activated, and outputting the coding signal into the encoder when a read control signal is activated.

8. The device according to claim 3, wherein the D/A converter comprises:

a reference level generator for controlling a voltage level of the reference level signal by regulating a size of a nonvolatile ferroelectric capacitor depending on voltage levels of the plurality of data register signals; and a common data bus driving unit for buffering and driving the reference level signal in a write mode to output into the common data bus unit.

9. The device according to claim 8, wherein the reference level generator comprises:

a switching unit for selectively outputting a plateline control signal depending on voltage levels of the plurality of data register signals;

a capacitor regulator comprising a plurality of nonvolatile ferroelectric capacitor, the regulator for selectively regulating the size of the capacitor in response to the plateline control signal and controlling a data voltage level of the reference level signal; and a precharge controller for precharging the reference level signal to a low level when an equalizing signal is enabled to a high level in a precharge mode.

10. The device according to claim 9, wherein the switching unit comprises a plurality of transmission gates for outputting the plateline control signal when the plurality of data register signals are inputted with a high level, the plurality of transmission gates corresponding to the number of data register signals.

11. The device according to claim 8, wherein the common data bus driving unit comprises:

a buffer for amplifying and driving current of the reference level signal; and a driving unit for outputting an output signal from the buffer into the common data bus unit when a driving enable signal activated in a write mode is enabled.

12. A nonvolatile ferroelectric memory device having a multi-bit control function, comprising:

a plurality of cell array blocks for outputting a plurality of different cell data sensing voltages induced to a main bitline in a reference timing strobe interval, wherein each of the plurality of cell array blocks comprises a nonvolatile ferroelectric memory;

a timing data register array unit for outputting a plurality of bit data corresponding to a plurality of sensing data levels detected when the plurality of cell data sensing voltages reach a preset sensing critical voltage, and for converting a plurality of inputted bit data or the plurality of sensing data levels into analog reference level signals; and a common data bus unit, connected in common to the plurality of cell array blocks, for controlling data exchange between the plurality of cell array blocks and the timing data register array unit.

13. The device according to claim 12, wherein each of the plurality of cell array blocks comprises:

a main bitline pull-up controller for pulling up the main bitline in response to a main bitline pull-up control signal;

a main bitline sensing load unit for controlling sensing load of the main bitline in response to a main bitline control signal;

a plurality of sub cell arrays each comprising the nonvolatile ferroelectric memory; and a column selecting switch unit for selectively connecting the common data bus unit to the main bitline in response to a column selecting signal.

14. The device according to claim 12, wherein the timing data register array unit comprises:

a sense amplifier for sensing the plurality of cell data sensing voltages applied from the common data bus unit depending on the logic threshold voltage in different timings while a first sensing control signal is enabled, and for outputting a plurality of sensing data levels, the sense amplifier having the preset sensing critical voltage;

a data register array unit for storing the plurality of sensing data levels applied from the sense amplifier in response to a second sensing control signal when a plurality of lock signals are activated having a predetermined time difference, and for outputting a plurality of data register signals;

a decoder for decoding input data applied from a timing data buffer unit through a data buffer bus unit, and for outputting a plurality of coding signals into the data register array unit;

an encoder for encoding the plurality of coding signals applied from the data register array unit, and for outputting the encoded signals into the data buffer bus unit;

a D/A converter for converting the plurality of data register signals into analog reference level signals, and for outputting the converted signals into the common data bus unit; and a bus pull-up unit for pulling up the common data bus unit to a power voltage in response to a data bus pull-up control signal.

15. The device according to claim 14, wherein the sense amplifier comprises:

a first driver for supplying a ground voltage when the first sensing control signal is activated;

a second driver and a third driver for comparing the plurality of cell data sensing voltages with the level of the preset logic threshold voltage, and selectively outputting the ground voltage or power voltage into a first node; and a fourth driver for precharging the first node to the power voltage when the first sensing control signal is inactivated and a sensing pull-up control signal is enabled.

16. The device according to claim 14, wherein the data register array unit comprises a plurality of data registers, wherein each of the plurality of data registers comprises:

a lock switching unit for outputting a sensing data level applied from the sense amplifier when a lock signal is activated;

a data latch unit for storing the sensing data level applied from the lock switching unit when the second sensing control signal is activated;

a data input regulator for outputting a coding signal applied from the data buffer bus unit into the data latch unit when a write control signal is activated; and a data output regulator for outputting a data register signal into the D/A converter when a restore control signal is activated, and outputting the coding signal into the encoder when a read control signal is activated.

17. The device according to claim 14, wherein the D/A converter comprises:

a reference level generator for controlling a voltage level of the reference level signal by regulating a size of a nonvolatile ferroelectric capacitor depending on voltage levels of the plurality of data register signals; and a common data bus driving unit for buffering and driving the reference level signal, and outputting the buffered and driven reference level signal into the common data bus unit in a write mode.

18. The device according to claim 17, wherein the reference level generator comprises:

a switching unit for selectively outputting a plateline control signal depending on the voltage levels of the plurality of data register signals;

a capacitor regulator for controlling a data voltage level of the reference level signal by selectively regulating the size of the capacitor in response to the plateline control signal, the regulator comprising a plurality of nonvolatile ferroelectric capacitor; and a precharge controller for precharging the reference level signal to a low level when an equalizing signal is enabled to a high level in a precharge mode.

19. The device according to claim 18, wherein the switching unit comprises a plurality of transmission gates for outputs the plateline control signal when the plurality of data register signals are inputted as a high level, the plurality of transmission gates corresponding to the number of the plurality of data register signals.

20. The device according to claim 17, wherein the common data bus driving unit comprises:

a buffer for amplifying and driving current of the reference level signal; and a driving nit for outputting an output signal from the buffer into the common data bus unit when a driving enable signal activated in the write mode is enabled.

* * * * *